United States Patent
Lee

(10) Patent No.: US 7,773,102 B2
(45) Date of Patent: *Aug. 10, 2010

(54) APPARATUS AND METHOD FOR DRIVING A DISPLAY DEVICE INCLUDING FOUR COLOR PIXELS

(75) Inventor: Baek-Woon Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 918 days.

This patent is subject to a terminal disclaimer.

(21) Appl. No.: 11/109,590

(22) Filed: Apr. 18, 2005

(65) Prior Publication Data

US 2005/0231534 A1  Oct. 20, 2005

(30) Foreign Application Priority Data

Apr. 19, 2004  (KR) .................. 10-2004-0026751

(51) Int. Cl.
G09G 5/02  (2006.01)
(52) U.S. Cl. ....................... 345/690; 345/89
(58) Field of Classification Search .......... 345/77, 345/88, 89, 690, 590, 589; 382/274, 167, 382/162

See application file for complete search history.

(56) References Cited

U.S. PATENT DOCUMENTS

| 5,828,362 A * | 10/1998 | Takahashi et al. ............ 345/589 |
| 6,317,157 B1 * | 11/2001 | Takayama .................... 348/441 |
| 6,434,268 B1 * | 8/2002 | Asamura et al. ............. 382/167 |
| 6,885,380 B1 * | 4/2005 | Primerano et al. ............ 345/82 |
| 7,151,517 B2 * | 12/2006 | Lee ............................. 345/690 |
| 2003/0128872 A1 * | 7/2003 | Lee et al. ..................... 382/162 |
| 2004/0046725 A1 | 3/2004 | Lee |
| 2004/0150602 A1 * | 8/2004 | Furukawa et al. ............. 345/98 |
| 2004/0222999 A1 * | 11/2004 | Choi et al. .................... 345/690 |

FOREIGN PATENT DOCUMENTS

| CN | 1291849 | 4/2001 |
| JP | 11-174583 | 7/1999 |
| WO | WO01/37251 | * 5/2001 |

* cited by examiner

Primary Examiner—Chanh Nguyen
Assistant Examiner—Allison Walthall
(74) Attorney, Agent, or Firm—F. Chau & Associates, LLC

(57) ABSTRACT

An apparatus for driving a display device including a plurality of four color pixels is provided, which includes: an input unit receiving input three-color image signals; an image signal modifier converting the three-color image signals into output four-color image signals such that a maximum gray of the input three-color image signals is equal to a maximum gray of the output four-color image signals; and an output unit outputting the output four-color image signals.

15 Claims, 16 Drawing Sheets

APPARATUS AND METHOD FOR DRIVING A DISPLAY DEVICE INCLUDING FOUR COLOR PIXELS

BACKGROUND OF THE INVENTION (a) Field of the Invention

The present invention relates to an apparatus and a method of driving a display device.

(b) Description of the Related Art

Display devices include a cathode ray tube (CRT), a plasma display panel (PDP), a liquid crystal display (LCD), an organic light emitting display (OLED), etc. The display devices are used for various devices such as monitors, television sets, indoor and outdoor signboards, etc., and they are required to have high luminance for the television sets and the signboards. The LCD, which is a non-emissive display, has one of main disadvantages of low luminance.

An LCD includes two panels provided with field-generating electrodes such as pixel electrodes and a common electrode and a liquid crystal (LC) layer with dielectric anisotropy disposed between the panels. The pixel electrodes are arranged in a matrix and connected to switching elements such as thin film transistors (TFTs) such that they are supplied with data voltages row by row in a sequential manner. The common electrode covers an entire surface of one of the panels and it is supplied with a common voltage. A pixel electrode and a common electrode as well as a LC layer interposed therebetween form a LC capacitor, and the LCD capacitor and a switching element connected thereto are the basic elements of a pixel.

The LCD applies voltages to the field-generating electrodes to form an electric field in the LC layer and adjusts the field strength to control transmittance of light passing through the LC layer, thereby the realizing desired images on the display. The LCD reverses a polarity of data voltages, which are applied to the pixel electrodes, with respect to the common voltage by frame, row or dot in order to prevent the deterioration of the LC layer due to long-time application of a unidirectional electric field.

In the meantime, each pixel represents a color for color display by providing red, green or blue color filter facing the pixel electrode.

The red, greed, and blue color filters are usually arranged in stripes, in mosaics, or in deltas. The striped arrangement arranges the color filters such that the color filters in a column represent the same color, and the mosaic arrangement arranges the color filters such that the red, green, and blue color filters are sequentially arranged in a row direction and in a column direction. In the deltaic arrangement, the color filters form a plurality of rows, each row including red, green, and blue color filters arranged in sequence, and the color filters in adjacent rows are offset. Since a dot in the deltaic arrangement can include red, green, and blue color filters arranged in a triangle, the deltaic arrangement has an advantage in displaying circles or oblique lines.

However, such a three color LCD has relatively low light efficiency since the red, green, and blue color filters reduce the transmittance of the incident light by one thirds.

SUMMARY OF THE INVENTION

An apparatus for driving a display device including a plurality of four color pixels is provided, which includes: an input unit receiving input three-color image signals; an image signal modifier converting the three-color image signals into output four-color image signals such that a maximum gray of the input three-color image signals is equal to a maximum gray of the output four-color image signals; and an output unit outputting the output four-color image signals.

The image signal modifier may: compare grays of the input three-color image signals, determine a maximum input gray, a middle input gray, and a minimum input gray, and assign order indices based thereon; gamma and reverse gamma converts the maximum input gray, the middle input gray, and the minimum input gray to obtain a maximum output gray (Max'), a middle output gray (Mid'), a minimum output gray (Min'), and an output white gray (W) of the output four-color image signals; and generate the output four-color image signals based on the order indices.

The maximum input gray (Max), the middle input gray (Mid), and the minimum input gray (Min) may have relations with the maximum output gray (Max'), the middle output gray (Mid'), the minimum output gray (Min'), and the output white gray (W) as follows:

when $\Gamma(Max) > [s_1/(s_1-1)]\Gamma(Min)$,

Max'=Max;

Mid'=Max $\Gamma^{-1}[\Gamma(Mid)-\Gamma(Min)]/[\Gamma(Max)-\Gamma(Min)]$;

Min'=0; and

W=Max Min/$\Gamma^{-1}[\Gamma(Max)-\Gamma(Min)]$, where $\Gamma$ is a gamma conversion function, $\Gamma^{-1}$ is a reverse gamma conversion function, and $s_1$ is a scaling factor.

The maximum input gray (Max), the middle input gray (Mid), and the minimum input gray (Min) may have relations with the maximum output gray (Max'), the middle output gray (Mid'), the minimum output gray (Min'), and the output white gray (W) as follows:

when $\Gamma(Max) \leq [s_1/(s_1-1)]\Gamma(Min)$,

Max'=Max;

Mid'=$\Gamma^{-1}\{s_1[\Gamma(Mid)-\Gamma(Max)]+\Gamma(Max)\}$;

Min'=$\Gamma^{-1}\{s_1[\Gamma(Min)-\Gamma(Max)]+\Gamma(Max)\}$; and

W=$\Gamma^{-1}[(s_1-1)\Gamma(Max)]$, where $\Gamma$ is a gamma conversion function, $\Gamma^{-1}$ is a reverse gamma conversion function, and $s_1$ is a scaling factor.

The gamma function may satisfy that $\Gamma(xy)=\Gamma(x)\Gamma(y)$ and $\Gamma^{-1}(pq)=\Gamma^{-1}(p)\Gamma^{-1}(q)$ and it may be an exponential function. The power of the gamma function may be equal to 2.4.

The scaling factor may be equal to two.

The gamma conversion and the reverse gamma conversion may be performed by using a look-up table.

The apparatus may further include: a gray voltage generator generating a plurality of gray voltages; and a data driver that selects gray voltages among the plurality of gray voltages corresponding to the output four-color image signals and outputs the selected gray voltages to the pixels as data voltages.

The order indices may apply an order of the grays of the input three-color image signals to the grays of the output four-color image signals.

An apparatus for driving a display device including a plurality of four color pixels is provided, which includes: an input unit receiving input three-color image signals; an image signal modifier converting the three-color image signals into output four-color image signals such that a gamma curve for achromatic color of the display device has no inflection point; and an output unit outputting the four-color image signals.

The image signal modifier may: compare grays of the input three-color image signals, determine a maximum input gray (Max), a middle input gray (Mid), and a minimum input gray (Min), and assign order indices based thereon; gamma and reverse gamma converts the maximum input gray, the middle input gray, and the minimum input gray to obtain a maximum output gray (Max'), a middle output gray (Mid'), a minimum output gray (Min'), and an output white gray (W) of the output four-color image signals; and generate the output four-color image signals based on the order indices.

The maximum input gray (Max), the middle input gray (Mid), and the minimum input gray (Min) may have relations with the maximum output gray (Max'), the middle output gray (Mid'), the minimum output gray (Min'), and the output white gray (W) as follows:

when $\Gamma(Max) > [s_1/(s_1-1)]\Gamma(Min)$,

Max'=Max;

Mid'=Max $\Gamma^{-1}[\Gamma(Mid)-\Gamma(Min)]/[\Gamma(Max)-\Gamma(Min)]$;

Min'=0; and $W$=Max Min/$\Gamma^{-1}[\Gamma(Max)-\Gamma(Min)]$, where $\Gamma$ is a gamma conversion function, $\Gamma^{-1}$ is a reverse gamma conversion function, and $s_1$ is a scaling factor.

The maximum input gray (Max), the middle input gray (Mid), and the minimum input gray (Min) may have relations with the maximum output gray (Max'), the middle output gray (Mid'), the minimum output gray (Min'), and the output white gray (W) as follows:

when $\Gamma(Max) \leq [s_1/(s_1-1)]\Gamma(Min)$,

Max'=Max;

Mid'=$\Gamma^{-1}\{s_1[\Gamma(Mid)-\Gamma(Max)]+\Gamma(Max)\}$;

Min'=$\Gamma^{-1}\{s_1[\Gamma(Min)-\Gamma(Max)]+\Gamma(Max)\}$; and $W$=$\Gamma^{-1}[(s_1-1)\Gamma(Max)]$, where $\Gamma$ is a gamma conversion function, $\Gamma^{-1}$ is a reverse gamma conversion function, and $s_1$ is a scaling factor.

The image signal modifier may give order indices according to the maximum input gray, the middle input gray, and the minimum input gray the input three-color image signals, and generates the four-color image signals based on the order indices.

The gamma function may an exponential function and the scaling factor may equal to two.

A method of driving a display device including a plurality of four color pixels is provided, which includes: assigning order indices after comparing grays of the input three-color image signals and determining a maximum input gray (Min), a middle input gray (Mid), and a minimum input gray (Min); gamma converting ($\Gamma$) and reverse gamma converting ($\Gamma^{-1}$) the maximum input gray, the middle input gray and the minimum input gray; obtaining a maximum output gray (Max'), a middle output gray (Mid'), a minimum output gray (Min'), and an output white gray (W), from relations Max'=Max, Mid '=Max $\Gamma^{-1}[\Gamma(Mid)-\Gamma(Min)]/[\Gamma(Max)-\Gamma(Min)]$, Min'=0, and $W$=Max Min/$\Gamma^{-1}[\Gamma(Max)-\Gamma(Min)]$, when $\Gamma(Max) > [s_1/(s_1-1)]\Gamma(Min)$ (where $s_1$ is a scaling factor); and from relations Max'=Max, Mid'=$\Gamma^{-1}\{s1[\Gamma(Mid)-\Gamma(Max)]+\Gamma(Max)\}$, Min'=$\Gamma^{-1}\{s_1[\Gamma(Min)-\Gamma(Max)]+\Gamma(Max)\}$, and $W$=$\Gamma^{-1}[(s_1-1)\Gamma(Max)]$, when $\Gamma(Max) \leq [s_1/(s_1-1)]\Gamma(Min)$; and generating four-color image signals having the maximum output gray, the middle output gray, the minimum output gray, and the output white gray according to the order given by the order indices.

The gamma conversion and the reverse gamma conversion may be performed by using a look-up table.

The method may further include: generating a plurality of gray voltages; selecting data voltages among the plurality of gray voltages corresponding to the four-color image signals; and applying the data voltages to the pixels.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

Figure 1:
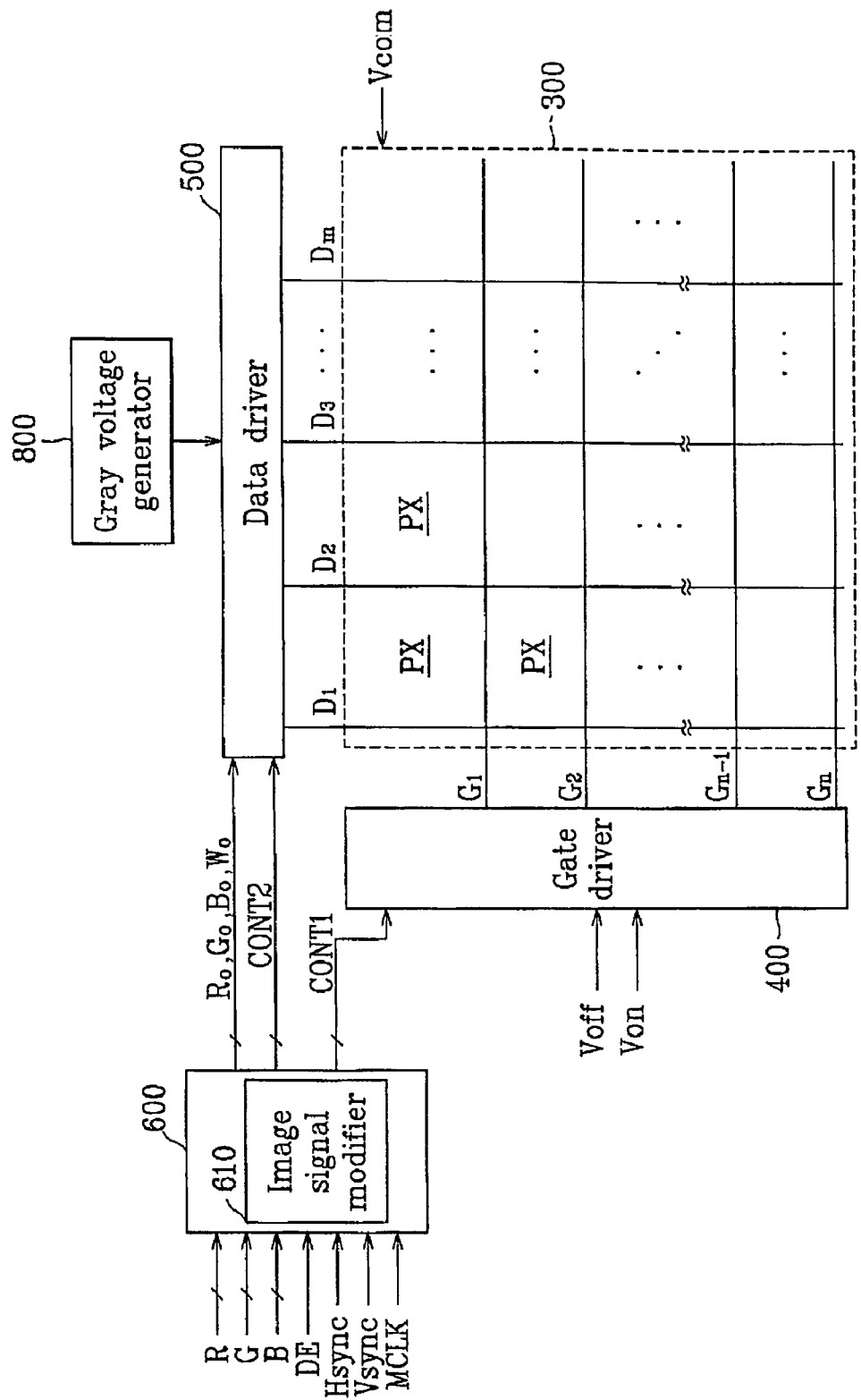
FIG. 1 is a block diagram of an LCD according to an embodiment of the present invention.

The present invention will now be described more fully hereinafter with reference to the accompanying drawings, in which embodiments of the invention are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, apparatus and methods of driving a display device are described with reference to accompanying drawings.

Figure 2:
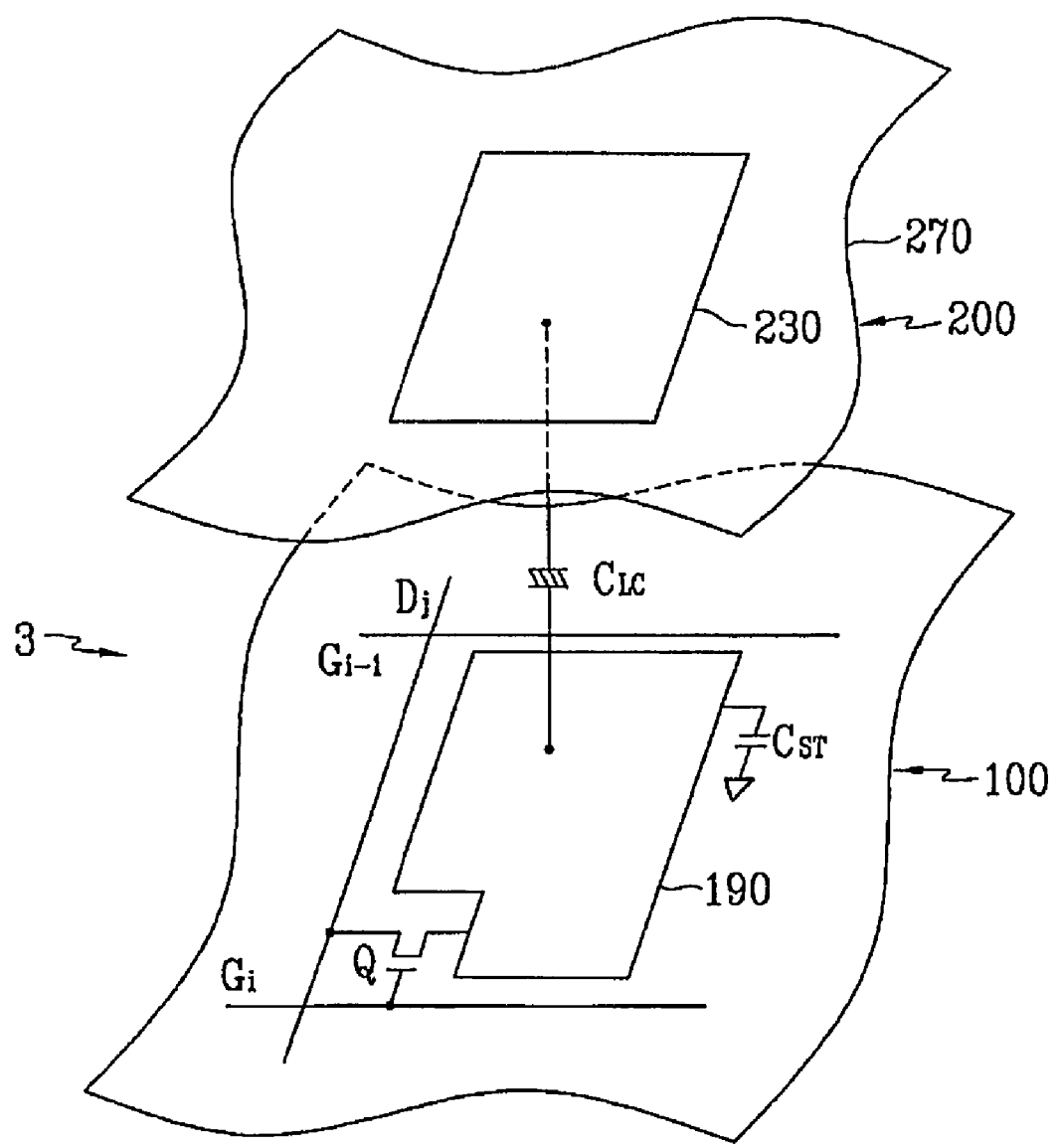
FIG. 2 is an equivalent circuit diagram of a pixel of an LCD according to an embodiment of the present invention.

FIG. 1 is a block diagram of a display device according to an embodiment of the present invention and FIG. 2 is an equivalent circuit diagram of a pixel of an LCD according to an embodiment of the present invention.

Referring to FIG. 1, a display device according to an embodiment of the present invention includes a panel unit 300, a gate driver 400 and a data driver 500 connected to the panel unit 300, a gray voltage generator 800 connected to the data driver 500, and a signal controller 600 controlling the above-described elements.

The panel unit 300 includes a plurality of display signal lines $G_1$-$G_n$ and $D_1$-$D_m$ and a plurality of pixels PX connected thereto and arranged approximately in a matrix from a circuital view as shown in FIG. 1.

The display signal lines $G_1$-$G_n$ and $D_1$-$D_m$ include a plurality of gate lines $G_1$-$G_n$ transmitting gate signals (also referred to as "scanning signals"), and a plurality of data lines $D_1$-$D_m$ transmitting data signals. The gate lines $G_1$-$G_n$ extend substantially in a row direction and substantially parallel to each other, while the data lines $D_1$-$D_m$ extend substantially in a column direction and substantially parallel to each other.

Referring to FIG. 2, each pixel PX of an LCD that is a representative of a flat panel display includes a switching element Q connected to the signal lines $G_1$-$G_n$ and $D_1$-$D_m$, and a LC capacitor $C_{LC}$ and a storage capacitor $C_{ST}$ that are connected to the switching element Q. The storage capacitor $C_{ST}$ may be omitted. A pixel of an OLED (not shown) may include a switching transistor, a driving transistor, a plurality of light emitting elements, and a storage capacitor.

The switching element Q is provided on the lower panel 100 and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on the upper panel 200 as two terminals. The LC layer 3 disposed between the two electrodes 190 and 270 functions as dielectric of the LC capacitor $C_{LC}$. The pixel electrode 190 is connected to the switching element Q. The common electrode 270 is connected to the common voltage $V_{com}$ and covers entire surface of the upper panel 200. Unlike FIG. 2, the common electrode 270 may be provided on the lower panel 100, and both electrodes 190 and 270 have shapes of bar or stripes.

The storage capacitor $C_{ST}$ is defined by the overlap of the pixel electrode 190 and a separate wire (not shown) provided on the lower panel 100 and supplied with a predetermined voltage such as the common voltage $V_{com}$. Alternatively, the storage capacitor $C_{ST}$ is defined by the overlap of the pixel electrode 190 and its previous gate line $G_{i-1}$ via an insulator.

Each pixel PX represents its own color by providing one of a plurality of color filters 230 in an area corresponding to the pixel electrode 190. The color filter 230 shown in FIG. 2 is provided on the upper panel 200. Alternatively, the color filters 230 are provided on or under the pixel electrode 190 on the lower panel 100.

The color of the color filter 230 is one of the primary colors such as red, green, blue, and white. Hereinafter, a pixel PX is referred to as red, green, blue or white pixel based on the color represented by the pixel PX and indicated by reference numeral RP, GP, BP or WP, which is also used to indicate a pixel area occupied by the pixel PX. The white pixel WP may have no color filter and may represent white color by means of other mechanisms.

A pair of polarizers (not shown) polarizing incident light is attached on the outer surfaces of the panels 100 and 200 of the panel unit 300 of an LCD.

Spatial arrangements of the pixels of the LCDs according to embodiments of the present invention are described with reference to FIGS. 3 to 8.

Figure 3:
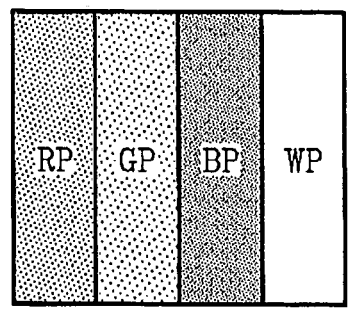
FIGS. 3-5 illustrate the striped arrangements of color filters in pixels of LCDs according to an embodiment of the present invention.
Figure 4:
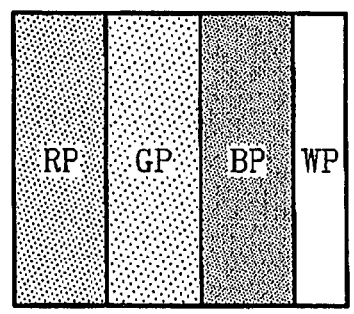
Figure 5:
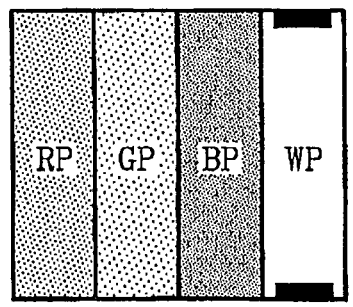

FIGS. 3-5 illustrate the striped arrangements of pixels of LCDs according to an embodiment of the present invention.

Referring to FIGS. 3-5, a plurality of pixels is arranged in a matrix including a plurality of pixel row and a plurality of pixel columns.

Each pixel row includes pixels representing four colors, i.e., red pixels RP, green pixels GP, blue pixels BP, and white pixels WP arranged in sequence, while each pixel column includes only one kind of pixels among the four color pixels RP, GP, BP and WP. The sequence of the pixels in a pixel row can be altered.

A group of four pixels shown in FIGS. 3-5 form a dot, which is an elementary unit for an image.

All pixels shown in FIG. 3 have substantially equal size, while the pixels shown in FIGS. 4 and 5 do not have equal size. Referring to FIGS. 4 and 5, the white pixel WP is smaller than the red, green and blue pixels RP, GP and BP to prevent the reduction of the color saturation due to the addition of the white pixel WP. The red, green and blue pixels RP, GP and BP may have equal size.

As shown in FIG. 4, the red, green and blue pixels RP, GP and BP are enlarged and the white pixel WP is reduced, compared with those shown in FIG. 3. The ratio of the size of the white pixel WP and the size of the red, green and blue pixels RP, GP and BP is determined by considering the luminance of a backlight unit (not shown) and a target color temperature. The size of the white pixel WP may be half or quarter of other pixels RP, GP and BP.

As shown in FIG. 5, the white pixel WP is reduced while the size of the red, green and blue pixels RP, GP and BP are not changed, as compared with those shown in FIG. 3. The reduction of the white pixel WP is obtained by widening the signal lines such as the gate lines $G_1$-$G_n$ or the data lines $D_1$-$D_m$ (shown in FIGS. 1 and 2) near the white pixel WP or by widening a portion of a black matrix (not shown), which can be provided on the upper panel 200, enclosing the white pixel WP. It is preferable that intersecting area between the gate lines $G_1$-$G_m$ and the data lines $D_1$-$D_m$ is not increased since the intersecting area causes capacitive load to the signal lines.

Figure 6:
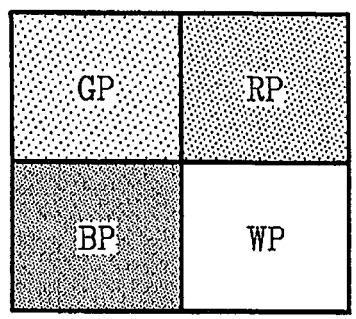
FIGS. 6-8 illustrate the mosaic pixel arrangements of color filters in LCDs according to an embodiment of the present invention.
Figure 7:
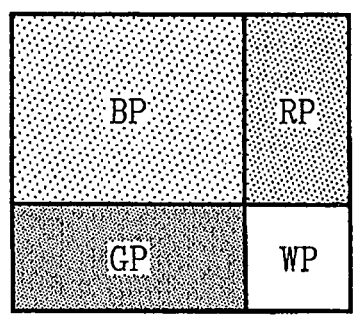
Figure 8:
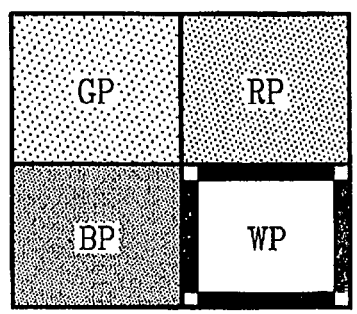

FIGS. 6-8 illustrate the mosaic pixel arrangements of LCDs according to an embodiment of the present invention.

Referring to FIGS. 6-8, each pixel row and each pixel column include two kinds of pixels among the four color pixels RP, GP, BP and WP.

Referring to FIGS. 6 and 8, the pixel rows including the green and red pixels GP and RP and the pixel rows including the blue and white pixels BP and WP are alternately arranged. In view of columns, the pixel columns including the green and blue pixels GP and BP and the pixel columns including the red and white pixels RP and WP are alternately arranged.

Referring to FIG. 7, the pixel rows including the blue and red pixels BP and RP and the pixel rows including the green and white pixels GP and WP are alternately arranged. In view of columns, the pixel columns including the blue and green pixels BP and GP and the pixel columns including the red and white pixels RP and WP are alternately arranged.

The sequence of the pixels in a pixel row and a pixel column can be also altered.

FIGS. 6-8 show a dot including a group of four pixels forming a 2×2 matrix.

All pixels shown in FIG. 6 have substantially equal size, while the pixels shown in FIGS. 7 and 8 do not have equal size. Referring to FIGS. 7 and 8, the white pixel WP is smaller than the red, green and blue pixels RP, GP and BP. The red, green and blue pixels RP, GP and BP may have equal or different sizes.

As shown in FIG. 7, the white pixel WP is reduced and the red, green and blue pixels RP, GP and BP are enlarged as compared with those shown in FIG. 6. The mosaic pixel arrangement prevents the red, green and blue pixels RP, GP and BP from being equally enlarged. As described above, the ratio of the size of the white pixel WP and the size of the red, green and blue pixels RP, GP and BP is determined by considering the luminance of a backlight unit and a target color temperature. Since the variation of the amount of the blue light is relatively insensitive to a person compared with red and green light, and hence, the influence of the areal increase of the blue pixel BP on the image quality is relatively small, it is preferable that the increased area of the blue pixel BP is larger than those of the red pixel RP and the green pixel GP and thus the sequence of the pixels are altered as shown in FIG. 7. The size of the white pixel WP may be quarter of the blue pixel BP and half of the red and green pixels RP and GP.

As shown in FIG. 8, the white pixel WP is reduced by widening both or either of portions of the gate lines G1-Gn and the data lines D1-Dm (shown in FIGS. 1 and 2) near the white pixel WP. It is also preferable that intersecting area between the gate lines G1-Gm and the data lines D1-Dm is not increased.

These configurations of a four color LCD increase the light transmittance.

Since the red, green and blue color filters transmit one thirds of incident light, the light transmittance of a white pixel WP is about three times that of other color pixels RP, GP and BP. Accordingly, the inclusion of the white pixels WP improves the optical efficiency without increasing the total area of the dot.

Assume that the amount of incident light is one.

For a dot including three pixels, i.e., red, green and blue pixels, the area of each pixel is one thirds of the total area of the dot. Since the light transmittance of the color filter in the pixels is one thirds, the total light transmittance of the dot is equal to $\frac{1}{3} \times \frac{1}{3} + \frac{1}{3} \times \frac{1}{3} + \frac{1}{3} \times \frac{1}{3} = \frac{1}{3} \approx 33.3\%$.

For a dot shown in FIGS. 3 and 6, the area of each pixel is a quarter of the total area. Since the light transmittance of the white pixel WP is one, while that of the other pixels RP, GP and BP is one thirds, the total light transmittance of the dot equals to $\frac{1}{4} \times \frac{1}{3} + \frac{1}{4} \times \frac{1}{3} + \frac{1}{4} \times \frac{1}{3} + \frac{1}{4} \times 1 = \frac{6}{12} \approx 50\%$. Accordingly, the brightness is increased to be about 1.5 times compared with a three-color LCD.

In addition, the reduction of the area of the white pixel WP shown in FIGS. 4, 5, 7 and 8 reduces deterioration of color level or color saturation (chromaticity), which may occur due to the increase of the luminance.

An exemplary detailed structure of a TFT array panel for an LCD according to an embodiment of the present invention will be described with reference to FIGS. 9 and 10.

Figure 9:
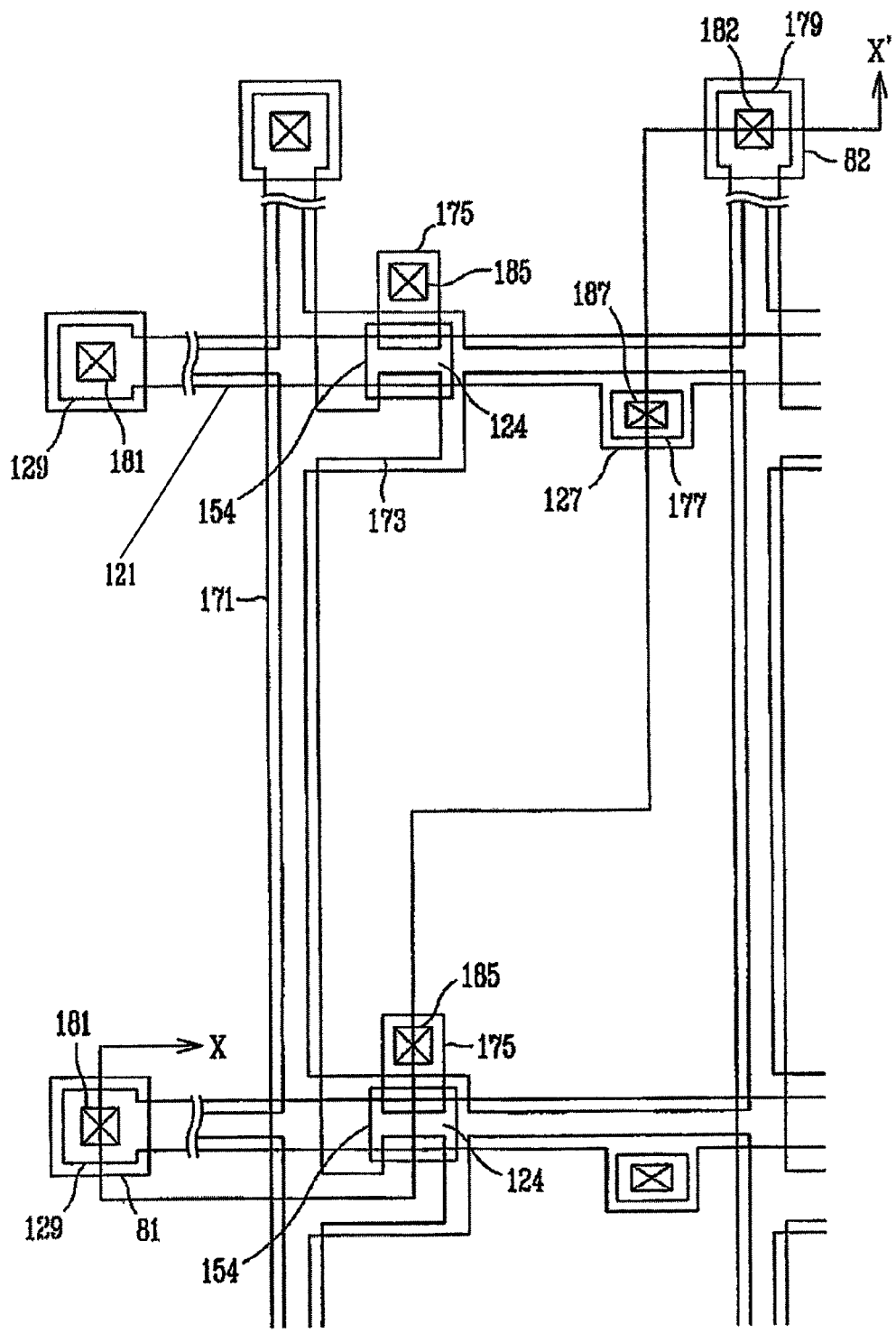
FIG. 9 is a layout view of an exemplary TFT array panel for an LCD according to an embodiment of the present invention.
Figure 10:
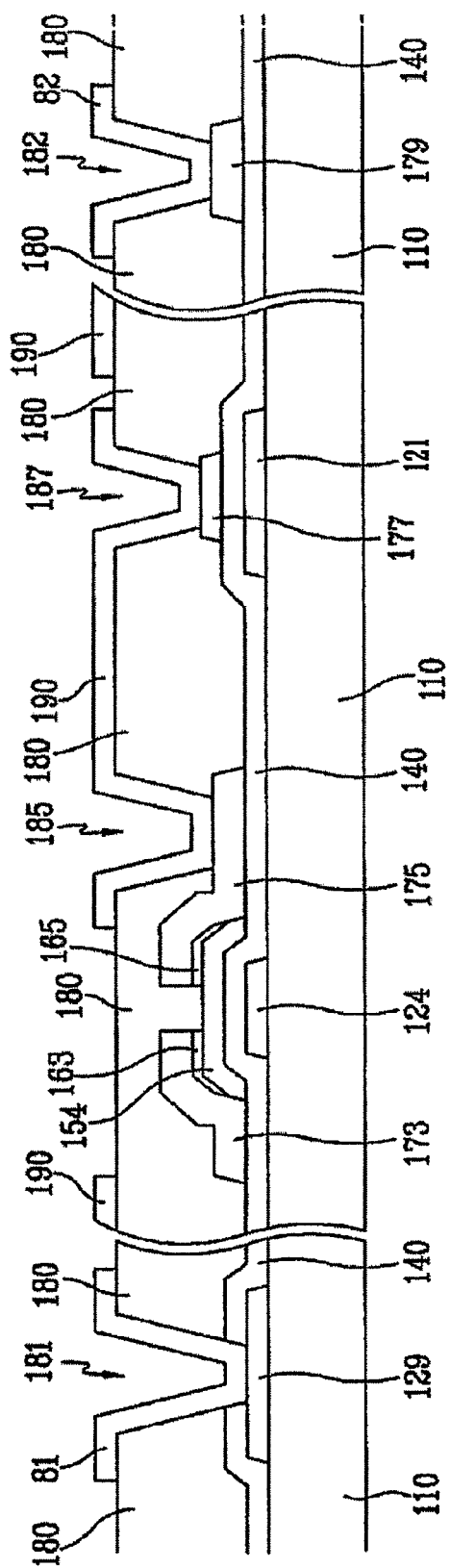
FIG. 10 is a sectional view of the TFT array panel shown in FIG. 9 taken along the line X-X'.

FIG. 9 is a layout view of an exemplary TFT array panel for an LCD according to an embodiment of the present invention, and FIG. 10 is a sectional view of the TFT array panel shown in FIG. 9 taken along the line X-X'.

A plurality of gate lines 121 are formed on an insulating substrate 110 such as transparent glass.

The gate lines 121 extend substantially in a transverse direction to transmit gate signals. Each gate line 121 includes a plurality of gate electrodes 124, a plurality of expansions 127 protruding downward; and an end portion 129 having a large area for contact with another layer or a driving circuit. The gate lines 121 may extend to be connected to a driving circuit that may be integrated on the lower panel 100.

The gate lines 121 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 may have a multi-layered structure including two films having different physical characteristics. One of the two films is preferably made of low resistivity metal including Al containing metal, Ag containing metal, and Cu containing metal for reducing signal delay or voltage drop in the gate lines 121. The other film is preferably made of material such as Mo containing metal, Cr, Ta or Ti, which has good physical, chemical, and electrical contact characteristics with other materials such as indium tin oxide (ITO) or indium zinc oxide (IZO). Good examples of the combination of the two films are a lower Cr film and an upper Al (alloy) film and a lower Al (alloy) film and an upper Mo (alloy) film. However, they may be made of various metals or conductors.

The lateral sides of the gate lines 121 are inclined relative to a surface of the substrate, and the inclination angle thereof ranges about 30-80 degrees.

A gate insulating layer 140 preferably made of silicon nitride (SiNx) is formed on the gate lines 121.

A plurality of semiconductor islands 154 preferably made of hydrogenated amorphous silicon (abbreviated to "a-Si") or polysilicon are formed on the gate insulating layer 140.

A plurality of ohmic contact islands 163 and 165 preferably made of silicide or n+ hydrogenated a-Si heavily doped with n type impurity are formed on the semiconductor islands 154. The ohmic contact islands 163 and 165 are located in pairs on the semiconductor islands 154.

The lateral sides of the semiconductor stripes 151 and the ohmic contacts 163 and 165 are inclined relative to a surface of the substrate, and the inclination angles thereof are preferably in a range of about 30-80 degrees.

A plurality of data lines 171, a plurality of drain electrodes 175, and a plurality of storage capacitor conductors 177 are formed on the ohmic contacts 163 and 165 and the gate insulating layer 140.

The data lines 171 extend substantially in the longitudinal direction to transmit data voltages and intersect the gate lines 121. Each data line 171 includes an end portion 179 having a large area for contact with another layer or an external device and a plurality of source electrodes 173 projecting toward the gate electrodes 124. Each pair of the source electrodes 173 and the drain electrodes 175 are separated from each other and opposite each other with respect to a gate electrode 124.

A gate electrode 124, a source electrode 173, and a drain electrode 175 along with a semiconductor island 154 form a TFT having a channel formed in the semiconductor island 154 disposed between the source electrode 173 and the drain electrode 175.

The storage capacitor conductors 177 overlap the expansions 127 of the gate lines 121.

The data lines 171, the drain electrodes 175, and the storage capacitor conductors 177 are preferably made of refractory metal such as Cr, Mo, Ti, Ta or alloys thereof. However, they may have a multilayered structure including a refractory metal film (not shown) and a low resistivity film (not shown). Good example of the multi-layered structure are a double-layered structure including a lower Cr/Mo (alloy) film and an upper Al (alloy) film and a triple-layered of a lower Mo (alloy) film, an intermediate Al (alloy) film, and an upper Mo (alloy) film.

Like the gate lines 121, the data lines 171, the drain electrodes 175, and the storage conductors 177 have inclined edge profiles, and the inclination angles thereof range about 30-80 degrees.

The ohmic contacts 163 and 165 are interposed only between the underlying semiconductor islands 154 and the overlying conductors 171 and 175 thereon and reduce the contact resistance therebetween.

A passivation layer 180 is formed on the data lines 171, the drain electrodes 175, the storage conductors 177, and the exposed portions of the semiconductor islands 154. The passivation layer 180 is preferably made of inorganic insulator such as silicon nitride or silicon oxide, photosensitive organic material having a good flatness characteristic, or low dielectric insulating material that have dielectric constant lower than 4.0 such as a-Si:C:O and a-Si:O:F formed by plasma enhanced chemical vapor deposition (PECVD). The passivation layer 180 may have a double-layered structure including a lower inorganic film and an upper organic film so that it may take the advantage of the organic film as well as it may protect the exposed portions of the semiconductor islands 154.

The passivation layer 180 has a plurality of contact holes 182, 185 and 187 exposing end portions 179 of the data lines 171, the drain electrodes 175, and the storage conductors 177, respectively. The passivation layer 180 and the gate insulating layer 140 has a plurality of contact holes 181 exposing end portions 129 of the gate lines 121.

A plurality of pixel electrodes 190 are formed on the passivation layer 180, and a plurality of contact assistants 81 and 82 are formed in the contact holes 181 and 182. The pixel electrodes 190 and the contact assistants 81 and 82 are preferably made of transparent conductor such as ITO or IZO or reflective conductor such as Ag or Al.

The pixel electrodes 190 are physically and electrically connected to the drain electrodes 175 through the contact holes 185 such that the pixel electrodes 190 receive the data voltages from the drain electrodes 175.

Referring back to FIG. 2, the pixel electrodes 190 supplied with the data voltages generate electric fields in cooperation with the common electrode 270 on the other panel 200, which determine the orientations of liquid crystal molecules of the LC layer 3 disposed between the two electrodes 190 and 270 or yield currents in a light emitting layer (not shown) to emit light.

As described above, a pixel electrode 190 and a common electrode 270 form a liquid crystal capacitor $C_{LC}$, which stores applied voltages after the TFT forming the switching element Q is turned off. The storage capacitors $C_{ST}$ are implemented by overlapping the pixel electrodes 190 with the gate lines 121 adjacent thereto (called "previous gate lines"). The capacitances of the storage capacitors, i.e., the storage capacitances, are increased by providing the expansions 127 at the gate lines 121 for increasing overlapping areas and by providing the storage capacitor conductors 177. The storage capacitor conductors 177 are connected to the pixel electrodes 190 and overlap the expansions 127 under the pixel electrodes 190 to decrease the distance between the terminals.

In one embodiment, the pixel electrodes 190 overlap the gate lines 121 and the data lines 171 to increase aperture ratio. In other embodiments, the overlap is optional.

The contact assistants 81 and 82 are connected to the exposed end portions 129 of the gate lines 121 and the exposed end portions 179 of the data lines 171 through the contact holes 181 and 182, respectively. The contact assistants 81 and 82 protect the exposed portions 129 and 179 and complement the adhesiveness of the exposed portion 129 and 179 and external devices.

Referring back to FIG. 1, the gray voltage generator 800 for an LCD generates two sets of a plurality of gray voltages related to the transmittance of the pixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel unit 300 and synthesizes the gate-on voltage Von and the gate off voltage Voff from an external device to generate gate signals for application to the gate lines $G_1$-$G_n$.

The data driver 500 is connected to the data lines $D_1$-$D_m$ of the panel unit 300 and applies data voltages selected from the gray voltages supplied from the gray voltage generator 800 to the data lines $D_1$-$D_m$.

The signal controller 600 controls the drivers 400 and 500, etc., and it includes an image signal modifier 610. The image signal modifier 610 may be a stand alone device.

Now, the operation of the LCD will be described in detail.

The signal controller 600 is supplied with three-color image signals R, G and B and input control signals controlling the display thereof such as a vertical synchronization signal Vsync, a horizontal synchronization signal Hsync, a main clock MCLK, and a data enable signal DE, from an external graphic controller (not shown). The image signal modifier 610 of the signal controller 610 converts the three-color image signals R, G and B into four-color image signals and processes and modifies the four-color image signals suitable for the operation of the panel unit 300 on the basis of the input control signals and the input image signals R, G and B. In addition, the signal controller 600 generates gate control signals CONT1 and data control signals CONT2 for controlling the processed and modified image signals Ro, Go, Bo and Wo. The signal controller 600 provides the gate control signals CONT1 for the gate driver 400, and the processed image signals Ro, Go, Bo and Wo and the data control signals CONT2 for the data driver 500.

The gate control signals CONT1 include a scanning start signal STV for instructing to start the scanning and at least one clock signal for controlling the output time of the gate-on voltage Von. The gate control signals CONT1 may further include an output enable signal OE for defining the duration of the gate-on voltage Von. The data control signals CONT2 include a horizontal synchronization start signal STH for informing data driver 500 of the start of a horizontal period, a load signal LOAD or TP for instructing data driver 500 to apply the appropriate data voltages to the data lines $D_1$-$D_m$, and a data clock signal HCLK. The data control signals CONT2 may further include an inversion control signal RVS for reversing the polarity of the data voltages (with respect to the common voltage Vcom).

The data driver 500 receives a packet of the image data Ro', Go', Bo' and Wo' for a pixel row from the signal controller 600 and converts the image data Ro', Go', Bo' and Wo' into the analog data voltages selected from the gray voltages supplied from the gray voltage generator 800 in response to the data control signals CONT2 from the signal controller 600. The data driver 500 then outputs the data voltages to the data lines $D_1$-$D_m$.

Responsive to the gate control signals CONT1 supplied from the signal controller 600, the gate driver 400 applies the gate-on voltage $V_{on}$ to the gate line $G_1$-$G_n$, thereby turning on the switching elements Q connected thereto. The data voltages applied to the data lines $D_1$-$D_m$ are supplied to the pixels through the activated switching elements Q.

In an LCD shown in FIG. 2, the difference between the data voltage and the common voltage Vcom applied to a pixel is expressed as a charged voltage of the LC capacitor $C_{LC}$, i.e., a pixel voltage. The liquid crystal molecules have orientations depending on the magnitude of the pixel voltage and the orientations determine the polarization of light passing through the LC capacitor $C_{LC}$. The polarizers convert the light polarization into the light transmittance.

By repeating this procedure by a unit of a horizontal period (which is indicated by 1H and equal to one period of the horizontal synchronization signal Hsync and the data enable signal DE), all gate lines $G_1$-$G_n$ are sequentially supplied with the gate-on voltage $V_{on}$ during a frame, thereby applying the data voltages to all pixels. When the next frame starts after finishing one frame, the inversion control signal RVS applied to the data driver 500 is controlled such that the polarity of the data voltages is reversed (which is called "frame inversion"). The inversion control signal RVS may be also controlled such that the polarity of the data voltages flowing in a data line in one frame are reversed (which is called "line inversion"), or the polarity of the data voltages in one packet are reversed (which is called "dot inversion").

Now, a method of converting three-color image signals into four-color image signals is described in detail.

First, a rule for converting the three-color image signals into the four-color image signals according to an embodiment of the present invention is described in detail with reference to FIGS. 11A and 11B.

Figure 11A:
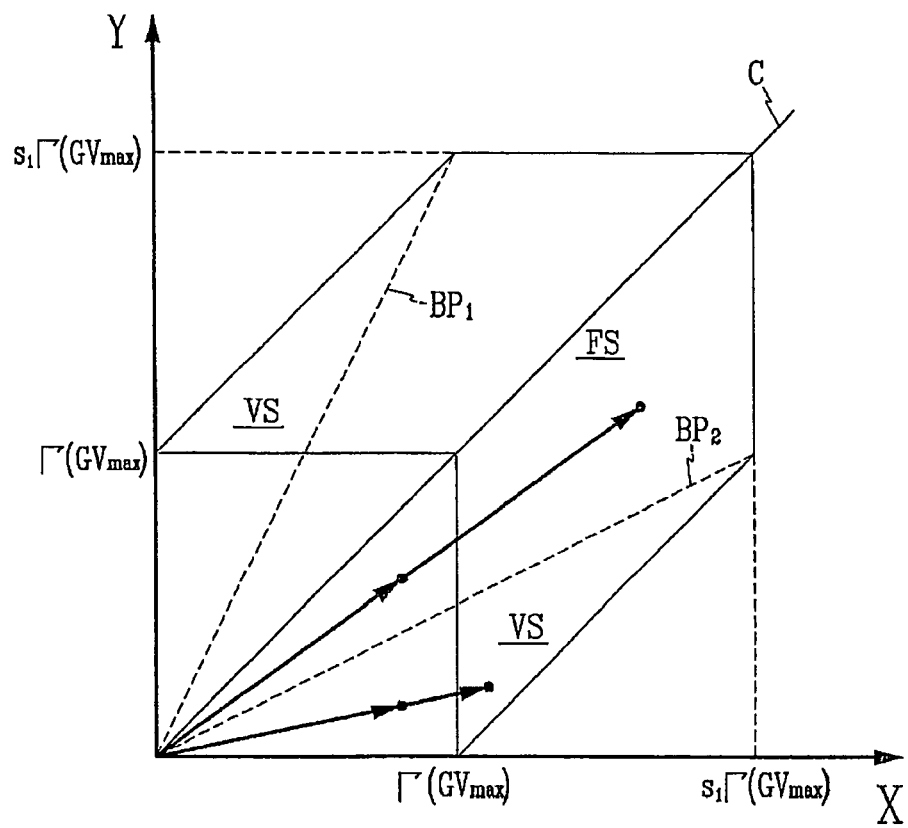
FIG. 11A illustrates Gamut surface formed by two axes in a three-dimensional color coordinates having three axes representing luminance of three primary colors, i.e., red, green, and blue colors, respectively.
Figure 11B:
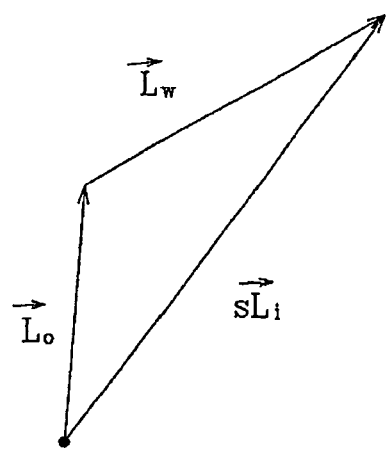
FIG. 11B illustrates decomposition of a luminance vector according to an embodiment of the present invention.

FIG. 11A illustrates Gamut surface formed by two axes in a three-dimensional color coordinates having three axes representing luminance of three primary colors, i.e., red, green, and blue colors, respectively, and FIG. 11B illustrates decomposition of a luminance vector according to an embodiment of the present invention.

A set of image signals, i.e., red, green, and blue image signals are represented by grays that in turn represent luminance. A gamma curve is a curve indicating a relation between gray and luminance. In the present description, the terms "gray" and "grays" refer to gray levels representing the image signals. A gamma conversion is a mapping from the gray into the luminance and a reverse gamma conversion is a reverse mapping of the gamma conversion, i.e., a mapping from the luminance to the gray. The gray is denoted by GV, the luminance is denoted by L, and a gamma function representing the gamma curve is denoted by $\Gamma$. Then, $$L = \Gamma(GV); \text{ and}$$

$$GV = \Gamma^{-1}(L). \quad \text{Relation 1}$$

If the gamma function is an exponential function, $$L = \alpha(GV)^\gamma; \text{ and}$$

$$GV = \beta L^{1/\gamma}. \quad \text{Relation 2}$$

Here, $\alpha$, $\beta$ and $\gamma$ are constants, in particular, $\gamma$ is referred to as gamma constant, and $\beta = \alpha^{-1/\gamma}$.

When the gamma function is an exponential function, etc., the gamma function satisfies, $$\Gamma(xy) = \Gamma(x)\Gamma(y); \text{ and}$$

$$\Gamma^{-1}(pq) = \Gamma^{-1}(p)\Gamma^{-1}(q). \quad \text{Relation 3}$$

In addition, the gamma function is an increasing function of the gray and a one-to-one function.

In the meantime, a set of three-color image signals are indicated by a point in a gray space that have three axes representing grays of respective colors and by a point in a luminance space that have three axes representing the luminance of respective colors as shown in FIG. 11A.

Since a point in a three-dimensional space can be represented by a vector, a point in a gray space is referred to as gray vector and a point in a luminance space is referred to as luminance vector. Then, for a set of three-color image signals, the relation between a gray vector $\vec{GV} = (GV_1, GV_2, GV_3)$ and a luminance vector $\vec{L} = (L_1, L_2, L_3)$ is given by:

$$\vec{L} = (\Gamma(GV_1), \Gamma(GV_2), \Gamma(GV_3)) = \vec{\Gamma}(\vec{GV}); \text{ and}$$

$$\vec{GV} = (\Gamma^{-1}(L_1), \Gamma^{-1}(L_2), \Gamma^{-1}(L_3)) = \vec{\Gamma}^{-1}(\vec{L}). \quad \text{Relation 4}$$

If different gamma curves are given to different colors, respective components of the vector relation have different gamma functions.

Referring to FIG. 11A, a square area (or a three-dimensional cubic area) enclosed by solid lines is an area that can be represented as the input three-color image signals, and a hexagonal area by solid lines is an area that can be represented as the output four-color image signals. The hexagonal area is obtained by extending the square area along a diagonal. Therefore, the conversion of the three-color image signals into the four-color image signals is equivalent to a mapping of a point in the square into a point in the hexagon.

This will be described more in detail.

A gray vector for a set of input three-color image signals is denoted by $\vec{I} = (I_1, I_2, I_3)$, where $I_1$, $I_2$, and $I_3$ are grays of the input three-color image signals. The gray vector is gamma converted as follows:

$$\vec{I} = \begin{pmatrix} I_1 \\ I_2 \\ I_3 \end{pmatrix} \xrightarrow{\Gamma} \vec{L}_i = \vec{\Gamma}(\vec{I}) = \begin{pmatrix} \Gamma(I_1) \\ \Gamma(I_2) \\ \Gamma(I_3) \end{pmatrix}, \quad \text{Relation 5}$$

where $\vec{L}_i$ is a luminance vector for the input three-color image signals.

Next, the luminance vector is multiplied by a scaling factor that reflects the luminance increase caused by adding a white pixel. The scaling factor is determined by characteristics of a display device and a gamma curve. The multiplication of the scaling factor corresponds to the above-describe mapping of a point in the square into a point in the hexagon.

$$\vec{L}_i = \begin{pmatrix} \Gamma(I_1) \\ \Gamma(I_2) \\ \Gamma(I_3) \end{pmatrix} \xrightarrow{s} s\vec{L}_i = s\vec{\Gamma}(\vec{I}) = \begin{pmatrix} s\Gamma(I_1) \\ s\Gamma(I_2) \\ s\Gamma(I_3) \end{pmatrix}, \quad \text{Relation 6}$$

where s is the scaling factor and $s\vec{L}_i$ is referred to as an magnified vector.

The scaling factor has different values in different areas in the luminance space. For example, it is assumed that X and Y represent the colors of the image signals having the minimum luminance and the maximum luminance, respectively, or vice versa in FIG. 11.

When the input three-color signals belong to a triangular area adjacent to the axes, the scaling factor has a value that varies depending on the luminance of the input three-color image signals and the triangular area is referred to as "variable scaling area" (VS). When the input three-color signals belong to a triangular area adjacent to a diagonal C, the scaling factor has a fixed value and the triangular area is referred to as "fixed scaling area" (FS).

For example, let the scaling factor for the fixed scaling area FS equal to a constant $s_1$ and equal to $s_2$ for the variable scaling area VS, which is given by $$s_2 = \frac{\Gamma(\max)}{\Gamma(\max) - \Gamma(\min)}, \quad \text{Relation 7}$$

where max and min denote maximum and minimum values of the three-color image signals.

In FIG. 11A, a boundary surface $BP_1$ between the fixed scaling area FS and the variable scaling area VS are written by:

$$Y = \frac{s_1 \Gamma(GV_{\max})}{s_1 \Gamma(GV_{\max}) - \Gamma(GV_{\max})} X = \frac{s_1}{s_1 - 1} X. \quad \text{Relation 8}$$

Another boundary surface $BP_2$ between the fixed scaling area FS and the variable scaling area VS are written by:

$$Y = \frac{s_1}{s_1 - 1} X. \quad \text{Relation 9}$$

Here, $GV_{max}$ is the highest gray value for each image signal.

If Y axis represent the maximum image signal, the luminance vector of the input three-color image signals is disposed over a diagonal plane C represented by X=Y. On the contrary, the luminance vector is disposed below the plane C if X axis represent the maximum image signal.

Accordingly, if $$\Gamma(\max) > \frac{s_1}{s_1 - 1} \Gamma(\min), \quad \text{Relation 10}$$

the image signals belong to the variable scaling area VS. If not, the image signals belong to the fixed scaling area FS.

In particular, when a white subpixel is as large as red, green, and blue subpixels, the luminance is increased twice. In the above-described stripe arrangement, for example, when incident light amount is one, the total transmittance is about 33.3% since the size of each subpixel and the transmittance of each color filter is about one thirds. Since the transmittance of a white subpixel is one, the white subpixel having the same size as the other subpixels exhibits the transmittance of 33.3% and thus the total transmittance is increased twice. Therefore, $s_1=2$ is reasonable.

The luminance vector $s\vec{L}_i$ obtained from Relation 6 is expressed as the addition of two vectors, a luminance vector $\vec{L}_o$ covered by red, green, and blue subpixels and a luminance vector $\vec{L}_w$ covered by a white subpixel as shown in FIG. 11B.

$$s\vec{L}_i = \vec{L}_o + \vec{L}_w. \quad \text{Relation 11}$$

Since white light is obtained by composing red, green, and blue light in equal ratio, $$\vec{L}_w = \vec{\Gamma}(\vec{W}) = \begin{pmatrix} \Gamma(W) \\ \Gamma(W) \\ \Gamma(W) \end{pmatrix}, \quad \text{Relation 12}$$

where $\vec{W}$ is a gray vector for a white image signal.

Since the luminance vector $\vec{L}_w$ of the white signal is given by Relation 12, the luminance vector $\vec{L}_o$ of remaining three-color image signals is given by:

$$\begin{aligned} \vec{L}_o &= s\vec{L}_i - \vec{L}_w \\ &= s\vec{\Gamma}(\vec{I}) - \vec{\Gamma}(\vec{W}) \\ &= \begin{pmatrix} s\Gamma(I_1) - \Gamma(W) \\ s\Gamma(I_2) - \Gamma(W) \\ s\Gamma(I_3) - \Gamma(W) \end{pmatrix}. \end{aligned} \quad \text{Relation 13}$$

Next, the luminance vector $\vec{L}_o$ of the output three-color image signals is reverse gamma converted to generate a gray vector $\vec{O}$.

$$\begin{aligned} \vec{L} \xrightarrow{\Gamma^{-1}} \vec{O} &= \vec{\Gamma}^{-1}(\vec{L}_o) \\ &= \vec{\Gamma}^{-1}(s\vec{\Gamma}(\vec{I}) - \vec{\Gamma}(\vec{W})) \\ &= \begin{pmatrix} \Gamma^{-1}(s\Gamma(I_1) - \Gamma(W)) \\ \Gamma^{-1}(s\Gamma(I_2) - \Gamma(W)) \\ \Gamma^{-1}(s\Gamma(I_3) - \Gamma(W)) \end{pmatrix} \end{aligned} \quad \text{Relation 14}$$

-continued $$\equiv \begin{pmatrix} O_1 \\ O_2 \\ O_3 \end{pmatrix}.$$

Then, a method of modifying image signals based on this basic rule according to an embodiment of the present invention is described in detail with reference to FIGS. 12A, 12B and 13.

Figure 12A:
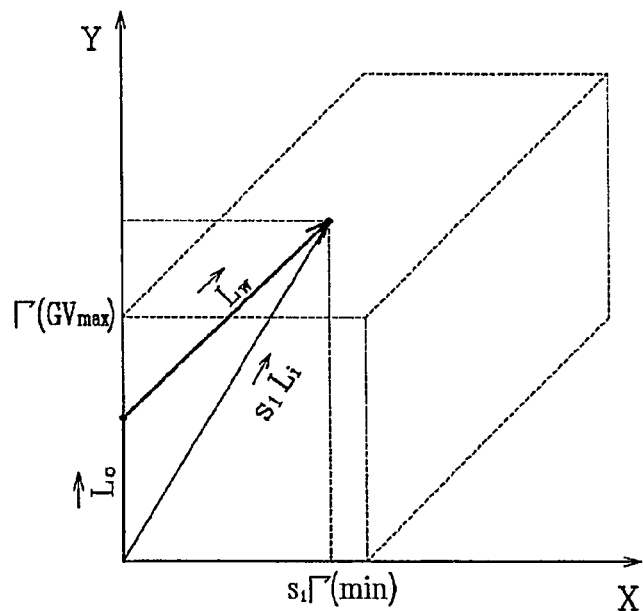
FIGS. 12A and 12B are graphs illustrating a luminance vector of a white signal and a luminance vector of output three-color signals according to an embodiment of the present invention.
Figure 12B:
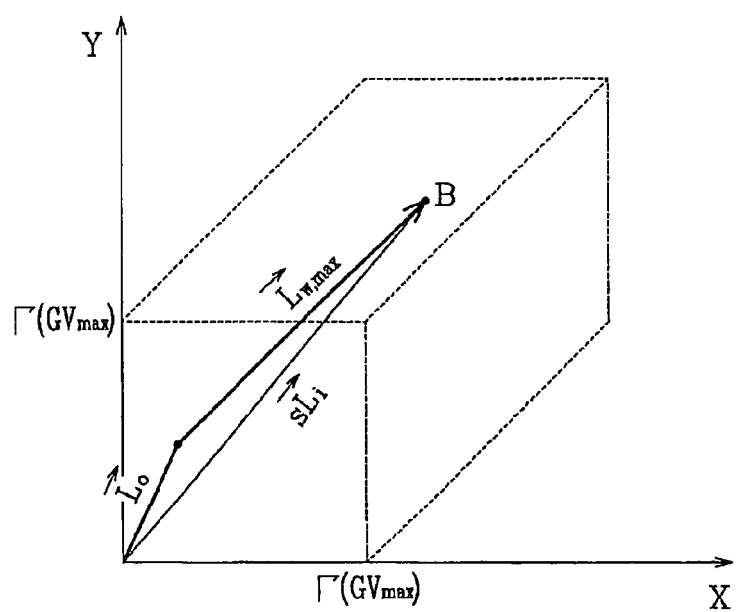

FIGS. 12A and 12B are graphs illustrating a luminance vector of a white signal and a luminance vector of output three-color signals according to an embodiment of the present invention.

An example shown in FIGS. 12A and 12B classifies the conversion in the fixed scaling area FS into two cases.

First, referring to FIG. 12A, each component of the luminance vector $\vec{L}_w$ of the white signal is determined as the minimum of the components of the magnified vector $s_1 \vec{L}_i$. Since the minimum of the components of the magnified vector $s_1 \vec{L}_i$ is equal to $s_1 \Gamma(\min)$, Relation 15 is derived from Relation 12:

$$\vec{L}_w = \begin{pmatrix} s_1 \Gamma(\min) \\ s_1 \Gamma(\min) \\ s_1 \Gamma(\min) \end{pmatrix}.$$
Relation 15

The gray of the white image signal is giving by $W=\Gamma^{-1}(s_1\Gamma(\min))$. Relation 16

However, the gray W of the white image signal obtained by Relation 16 should not be higher than the highest gray $W_{max}$. Therefore, when the gray W of the output white image signal calculated from Relation 16 is higher than the highest gray $W_{max}$ or $s_1\Gamma(\min)$ is larger than the luminance $\Gamma(W_{max})$ of the highest gray, that is, $W>W_{max}$, or Relation 17

$s_1\Gamma(\min)>\Gamma(W_{max})$, Relation 18 a rule shown in FIG. 12B is employed to determine the gray of output image signals.

Referring to FIG. 12B, the luminance vector $\vec{L}_{w,max}$ of the white image signal is defined as:

$$\vec{L}_{w,max} = \begin{pmatrix} \Gamma(\max) \\ \Gamma(\max) \\ \Gamma(\max) \end{pmatrix}.$$
Relation 19

Accordingly, the luminance vector $\vec{L}_o$ of the output three-color image signals is calculated from:

$\vec{L}_o = s\vec{L}_i - \vec{L}_{w,max}$. Relation 20

Now, a method of converting the three-color image signals into the four-color image signals based on the rule described with reference to FIGS. 12A and 12B according to an embodiment of the present invention is described in detail with reference to FIGS. 13 and 14.

Figure 13:
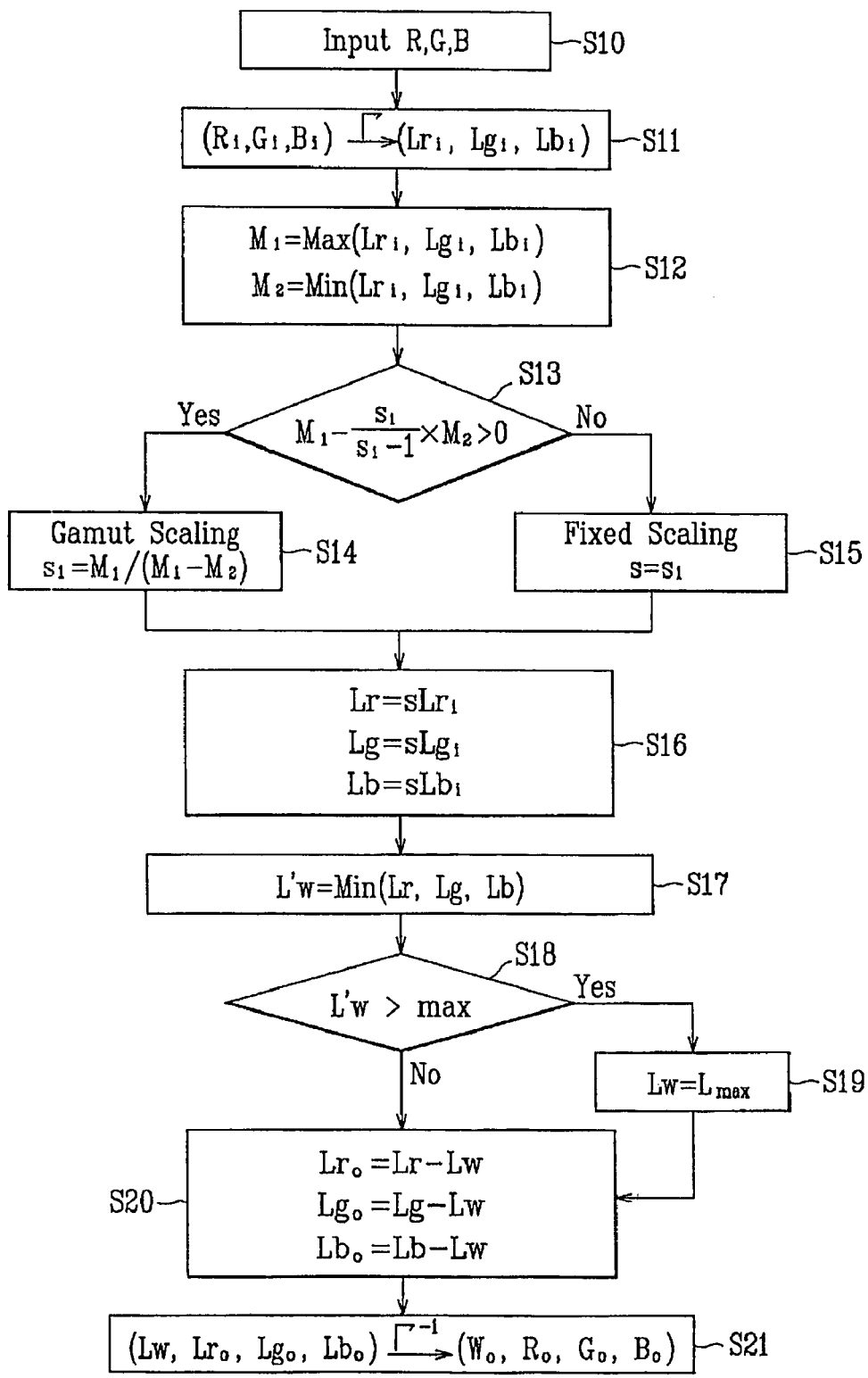
FIG. 13 is a flow chart illustrating a method of converting the three-color image signals into the four-color image signals according to an embodiment of the present invention.

FIG. 13 is a flow chart illustrating a method of converting the three-color image signals into the four-color image signals according to an embodiment of the present invention.

When a set of red, green, and blue signals having gray values $R_i$, $G_i$, and $B_i$ are received (S10), the input image signals are gamma converted to obtain luminance values $Lr_i$, $Lg_i$, and $Lb_i$ (S11).

Next, the maximum $M_1$ and the minimum $M_2$ among the luminance values are determined (S12). That is, $M_1=\text{Max}(Lr_i,Lr_i,Lr_i)$, and Relation 21

$M_2=\text{Min}(Lri,Lr_i,Lr_i)$. Relation 22

Here, Max(x, y, . . . ) means the maximum among x, y, . . . and Min(x, y, . . . ) means the minimum among x, y, . . .

Since the gamma function is an increasing function as described above, $\text{Max}(Lr_i, Lg_i, Lb_i)=\Gamma(\max)$ and $\text{Min}(Lr_i, Lg_i, Lb_i)=\Gamma(\min)$, where max and min are the maximum and the maximum among the gray values $R_i$, $G_i$, and $B_i$ of the input image signals, respectively.

Next, it is determined whether $$M_1 - \frac{s_1}{s_1-1}M_2 > 0,$$
Relation 23 and it is determined which area the set of the image signals $R_i$, $G_i$, and $B_i$ belongs to among the variable scaling area VS and the fixed scaling area FS (S13). Relation 23 and Relation 10 indicate substantially the same relation and $s_1$ is a scaling factor in the fixed scaling area FS as described above.

If the image signal set satisfies Relation 23, the set of image signals is determined to belong to the variable scaling area VS, and thus the scaling factor s is given from Relation 7 as follows (S14):

$s=M_1/(M_1-M_2)$. Relation 24

Otherwise, i.e., if the input image signal set does not meet Relation 23, it is considered to belong to the fixed scaling area FS and thus the scaling factor s is given as follows (S15):

$s=s_1$. Relation 25

Next, the scaling factor s is multiplied to the luminance values $Lr_i$, $Lg_i$, and $Lb_i$ to calculate magnification values Lr, Lg, and Lb (S16).

$$\begin{pmatrix} Lr \\ Lg \\ Lb \end{pmatrix} = \begin{pmatrix} sLr_i \\ sLg_i \\ sLg_i \end{pmatrix}.$$
Relation 26

Thereafter, preliminary luminance value L'w of the white signal is extracted (S17). The preliminary luminance value L'w of the white signal is determined as the minimum of the magnification values Lr, Lg, and Lb. That is, L'w=Min(Lr,Lg,Lb). Relation 27

Next, it is determined whether the luminance value L'w of the extracted white signal is higher than the maximum luminance $L_{max}=\Gamma(W_{max})$ that can be represented by the white subpixel, for example, the 255-th gray among the zero-th to the 255-th grays (S18). That is, it is determined whether L'w=$L_{max}$. Relation 28

If the luminance value L'w satisfies Relation 28, the luminance Lw of the white signal is determined by (S19):

$$L_w = L_{max} = \Gamma(W_{max}) \quad \text{Relation 29}$$

However, it Relation 29 is not satisfied, the luminance Lw of the white signal is determined to be equal to the value calculated from Relation 27. That is, $$L_w = L'_w = \text{Min}(L_r, L_g, L_b). \quad \text{Relation 30}$$

Next, the luminance values $L_{r_o}$, $L_{g_o}$, and $L_{b_o}$ of red, green, and blue output image signals are determined to be equal to the magnification values Lr, Lg, and Lb subtracted by the luminance values Lw of the white signal (S20). That is, $$L_{r_o} = L_r - L_w;$$

$$L_{g_o} = L_g - L_w; \text{ and}$$

$$L_{b_o} = L_b - L_w. \quad \text{Relation 31}$$

The luminance values Lw, $L_{r_o}$, $L_{g_o}$, and $L_{b_o}$ of white, red, green, and blue output signals are reverse gamma inverted to obtain the gray values Wo, Ro, Go, and Bo of the four-color image signals (S21).

In the meantime, maximum, middle, and minimum among the gray values of the input three-color image signals are denoted as max, mid, and min. The gray vector $\vec{I}$ of the input three-color image signals are considered to have max, mid, and min as its components.

$$\vec{I} = \begin{pmatrix} \max \\ \text{mid} \\ \min \end{pmatrix}. \quad \text{Relation 32}$$

Therefore, the luminance vector of the input three-color image signals $\vec{L}_i$, the magnified vector $s\vec{L}_i$, the luminance vector $\vec{L}_o$ of the output three-color image signals, and the gray vector $\vec{O}$ are given by:

$$\vec{L}_i = \vec{\Gamma}(\vec{I}) = \begin{pmatrix} \Gamma(\max) \\ \Gamma(\text{mid}) \\ \Gamma(\min) \end{pmatrix}; \quad \text{Relation 33}$$

$$s\vec{L}_i = s\vec{\Gamma}(\vec{I}) = \begin{pmatrix} s\Gamma(\max) \\ s\Gamma(\text{mid}) \\ s\Gamma(\min) \end{pmatrix}; \quad \text{Relation 34}$$

$$\vec{L}_o = s\vec{L}_i - \vec{L}_w \quad \text{Relation 35}$$
$$= s\vec{\Gamma}(\vec{I}) - \vec{\Gamma}(\vec{W})$$
$$= \begin{pmatrix} s\Gamma(\max) - \Gamma(W) \\ s\Gamma(\text{mid}) - \Gamma(W) \\ s\Gamma(\min) - \Gamma(W) \end{pmatrix}; \text{ and}$$

-continued $$\vec{O} = \vec{\Gamma}^{-1}(\vec{L}_o) \quad \text{Relation 36}$$
$$= \vec{\Gamma}^{-1}(s\vec{\Gamma}(\vec{I}) - \vec{\Gamma}(\vec{W}))$$
$$= \begin{pmatrix} \Gamma^{-1}(s\Gamma(\max) - \Gamma(W)) \\ \Gamma^{-1}(s\Gamma(\text{mid}) - \Gamma(W)) \\ \Gamma^{-1}(s\Gamma(\min) - \Gamma(W)) \end{pmatrix}$$
$$\equiv \begin{pmatrix} \max' \\ \text{mid}' \\ \min' \end{pmatrix}.$$

For the variable scaling area VS, the luminance value of the white image signal is defined as the minimum of the components of the magnified vector $s\vec{L}_i$, i.e., $\Gamma(W) = s_2\Gamma(\min)$ when the gray vector $\vec{O}$ of the output three-color image signals is determined.

$$\begin{pmatrix} \max' \\ \text{mid}' \\ \min' \end{pmatrix} = \begin{pmatrix} \Gamma^{-1}(s_2\Gamma(\max) - \Gamma(W)) \\ \Gamma^{-1}(s_2\Gamma(\text{mid}) - \Gamma(W)) \\ \Gamma^{-1}(s_2\Gamma(\min) - \Gamma(W)) \end{pmatrix} \quad \text{Relation 37}$$
$$= \begin{pmatrix} \Gamma^{-1}(s_2\Gamma(\max) - s_2\Gamma(\min)) \\ \Gamma^{-1}(s_2\Gamma(\text{mid}) - s_2\Gamma(\min)) \\ \Gamma^{-1}(s_2\Gamma(\min) - s_2\Gamma(\min)) \end{pmatrix}$$
$$= \begin{pmatrix} \Gamma^{-1}(s_2[\Gamma(\max) - \Gamma(\min)]) \\ \Gamma^{-1}(s_2[\Gamma(\text{mid}) - \Gamma(\min)]) \\ 0 \end{pmatrix}.$$

Relation 37 is substituted with Relation 7 and using Relation 3, $$\begin{pmatrix} \max' \\ \text{mid}' \\ \min' \end{pmatrix} = \begin{pmatrix} \Gamma^{-1}\left(\frac{\Gamma(\max)}{\Gamma(\max) - \Gamma(\min)}[\Gamma(\max) - \Gamma(\min)]\right) \\ \Gamma^{-1}\left(\frac{\Gamma(\max)}{\Gamma(\max) - \Gamma(\min)}[\Gamma(\text{mid}) - \Gamma(\min)]\right) \\ 0 \end{pmatrix} \quad \text{Relation 38}$$
$$= \begin{pmatrix} \Gamma^{-1}(\Gamma(\max)) \\ \Gamma^{-1}(\Gamma(\max)) - \Gamma^{-1}\left(\frac{\Gamma(\text{mid}) - \Gamma(\min)}{\Gamma(\max) - \Gamma(\min)}\right) \\ 0 \end{pmatrix}$$
$$= \begin{pmatrix} \max \\ \max\Gamma^{-1}\left(\frac{\Gamma(\text{mid}) - \Gamma(\min)}{\Gamma(\max) - \Gamma(\min)}\right) \\ 0 \end{pmatrix}.$$

The gray value W of the white signal is given by:

$$W = \Gamma^{-1}(s_2\Gamma(\min)) \quad \text{Relation 39}$$
$$= \Gamma^{-1}\left(\frac{\Gamma(\max)\Gamma(\min)}{\Gamma(\max) - \Gamma(\min)}\right)$$
$$= \frac{\max \cdot \min}{\Gamma^{-1}(\Gamma(\max) - \Gamma(\min))}.$$

For the fixed scaling area FS, if Relation 18 is not satisfied, the luminance value of the white image signal is defined as the minimum of the components of the magnified vector $s\vec{L}_i$, i.e., $\Gamma(W)=s_1\Gamma(\min)$ when the gray vector $\vec{O}$ of the output three-color image signals is determined.

$$\begin{pmatrix} \max' \\ \text{mid}' \\ \min' \end{pmatrix} = \begin{pmatrix} \Gamma^{-1}(s_1\Gamma(\max)-s_1\Gamma(\min)) \\ \Gamma^{-1}(s_1\Gamma(\text{mid})-s_1\Gamma(\min)) \\ \Gamma^{-1}(s_1\Gamma(\min)-s_1\Gamma(\min)) \end{pmatrix} \quad \text{Relation 40}$$

$$= \begin{pmatrix} \Gamma^{-1}(s_1[\Gamma(\max)-\Gamma(\min)]) \\ \Gamma^{-1}(s_1[\Gamma(\text{mid})-\Gamma(\min)]) \\ 0 \end{pmatrix}.$$

The gray value W of the white signal is given by:

$$W=\Gamma^{-1}(s_1(\Gamma(\min))). \quad \text{Relation 41}$$

For the fixed scaling area FS, if Relation 18, i.e., $s_1\Gamma(\min)>W_{max}$ is satisfied, the luminance value of the white image signal is defined as the highest value, i.e., $\Gamma(W)=\Gamma(W_{max})$ when the gray vector $\vec{O}$ of the output three-color image signals is determined. Accordingly, $$\begin{pmatrix} \max' \\ \text{mid}' \\ \min' \end{pmatrix} = \begin{pmatrix} \Gamma^{-1}(s_1\Gamma(\max)-\Gamma(W_{max})) \\ \Gamma^{-1}(s_1\Gamma(\text{mid})-\Gamma(W_{max})) \\ \Gamma^{-1}(s_1\Gamma(\min)-\Gamma(W_{max})) \end{pmatrix}. \quad \text{Relation 42}$$

The gray value W of the white image signal is given by:

$$W=\Gamma^{-1}(\Gamma(\max))=W_{max}. \quad \text{Relation 43}$$

Now, a method of converting the three-color image signals into the four-color image signals based on the rule described with reference to FIGS. 12A and 12B according to another embodiment of the present invention will be described in detail with reference to FIG. 14.

Figure 14:
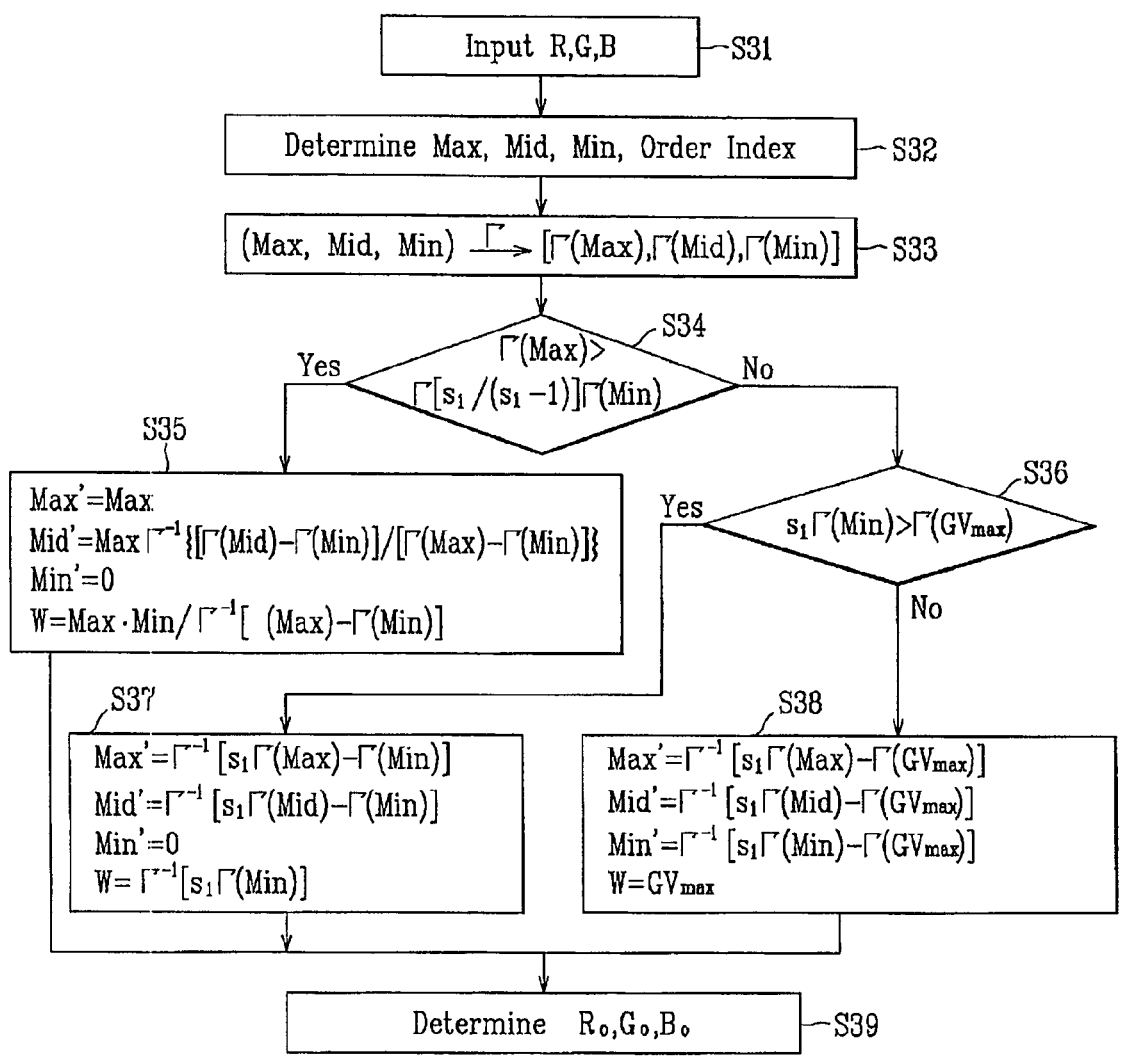
FIG. 14 is a flow chart illustrating a method of converting the three-color image signals into the four-color image signals according to another embodiment of the present invention.

FIG. 14 is a flow chart illustrating a method of converting the three-color image signals into the four-color image signals according to another embodiment of the present invention.

When a set of three-color image signals having gray values $R_i$, $G_i$, and $B_i$ (S31), the gray values $R_i$, $G_i$, and $B_i$ are arranged in order and assigned with order indices (S32). For example, If $R_i \geq G_i \geq B_i$, Max=$R_i$, Mid=$G_i$, Min=$B_i$, and Order Index=1;

If $R_i \geq B_i \geq G_i$, Max=$R_i$, Mid=$B_i$, Min=$G_i$, and Order Index=2;

If $G_i \geq B_i \geq R_i$, Max=$G_i$, Mid=$B_i$, Min=$R_i$, and Order Index=3;

If $G_i \geq R_i \geq B_i$, Max=$G_i$, Mid=$R_i$, Min=$B_i$, and Order Index=4;

If $B_i \geq R_i \geq G_i$, Max=$B_i$, Mid=$R_i$, Min=$G_i$, and Order Index=5; and If $B_i \geq G_i \geq R_i$, Max=$B_i$, Mid=$G_i$, Min=$R_i$, and Order Index=6. Relation 44

Then, the values Max, Mid, and Min are gamma converted (S33).

Next, it is determined using the values $\Gamma(\text{Max})$ and $\Gamma(\text{Min})$ obtained by gamma conversion which area the three-color image signals belong to among the variable scaling area VS and the fixed scaling area FS (S34). That is, it is determined whether $\Gamma(\text{Max})>[s_1/(s_1-1)]\Gamma(\text{Min})$. When $\Gamma(\text{Max})>[s_1/(s_1-1)]\Gamma(\text{Min})$, the three-color image signals belong to the variable scaling area VS and it goes to the step S35. If the relation $\Gamma(\text{Max})>[s_1/(s_1-1)]\Gamma(\text{Min})$ is not satisfied, it goes to the step S36.

When the input image signals belong to the variable scaling area VS, the gray values Max', Mid', Min', and W of the output four-color image signals are determined using Relations 38 and 39 (S35).

That is,

Max'=Max;

Mid'=Max $\Gamma^{-1}\{[\Gamma(\text{mid})-\Gamma(\min)]/[\Gamma(\max)-\Gamma(\min)]\}$;

Min'=0; and $$W=\text{Max Min}/\Gamma^{-1}[\Gamma(\max)-\Gamma(\min)]. \quad \text{Relation 45}$$

When the input image signals belong to the fixed scaling area FS, it is determined whether $s_1\Gamma(\text{Min})>\Gamma(GV_{max})$ (S36). Here, $GV_{max}$ is the highest gray as described above. This is to determine whether the gray value of the white image signal is higher than the highest gray.

If the above-described relation is not satisfied, the gray values Max', Mid', Min', and W are determined by using Relations 40 and 41 (S37).

Max'=$\Gamma^{-1}[s_1\Gamma(\max)-s_1\Gamma(\min)]$;

Mid'=$\Gamma^{-1}[s_1\Gamma(\text{mid})-s_1\Gamma(\min)]$;

Min'=0; and $$W=\Gamma^{-1}[s_1\Gamma(\min)]. \quad \text{Relation 46}$$

When $s_1\Gamma(\text{Min})>\Gamma(GV_{max})$ is satisfied, the gray values Max', Mid', Min', and W are determined by using Relations 42 and 43 (S38).

Max'=$\Gamma^{-1}[s_1\Gamma(\max)-\Gamma(GV_{max})]$;

Mid'=$\Gamma^{-1}[s_1\Gamma(\text{mid})-\Gamma(GV_{max})]$;

Min'=$\Gamma^{-1}[s_1\Gamma(\min)-\Gamma(GV_{max})]$; and $$W=GV_{max}. \quad \text{Relation 47}$$

The Order Index conserves the order of the gray values of the input signals as follows:

If Order Index=1, $R_o$=Max', $G_o$=Mid', and $B_o$=Min';

If Order Index=2, $R_o$=Max', $G_o$=Min', and $B_o$=Mid';

If Order Index=3, $R_o$=Min', $G_o$=Max', and $B_o$=Mid';

If Order Index=4, $R_o$=Mid', $G_o$=Max', and $B_o$=Min';

If Order Index=5, $R_o$=Mid', $G_o$=Min', and $B_o$=Max'; and

If Order Index=6, $R_o$=Min', $G_o$=Mid', and $B_o$=Max'. Relation 48

Therefore, the gray values $R_o$, $G_o$, and $B_o$ of red, green and blue output signals are determined by Relation 48 (S39).

Now, a method of determining the luminance value of the white signal in the fixed scaling area FS according to another embodiment of the present invention is described in detail with reference to FIGS. 15 and 16.

Figure 15:
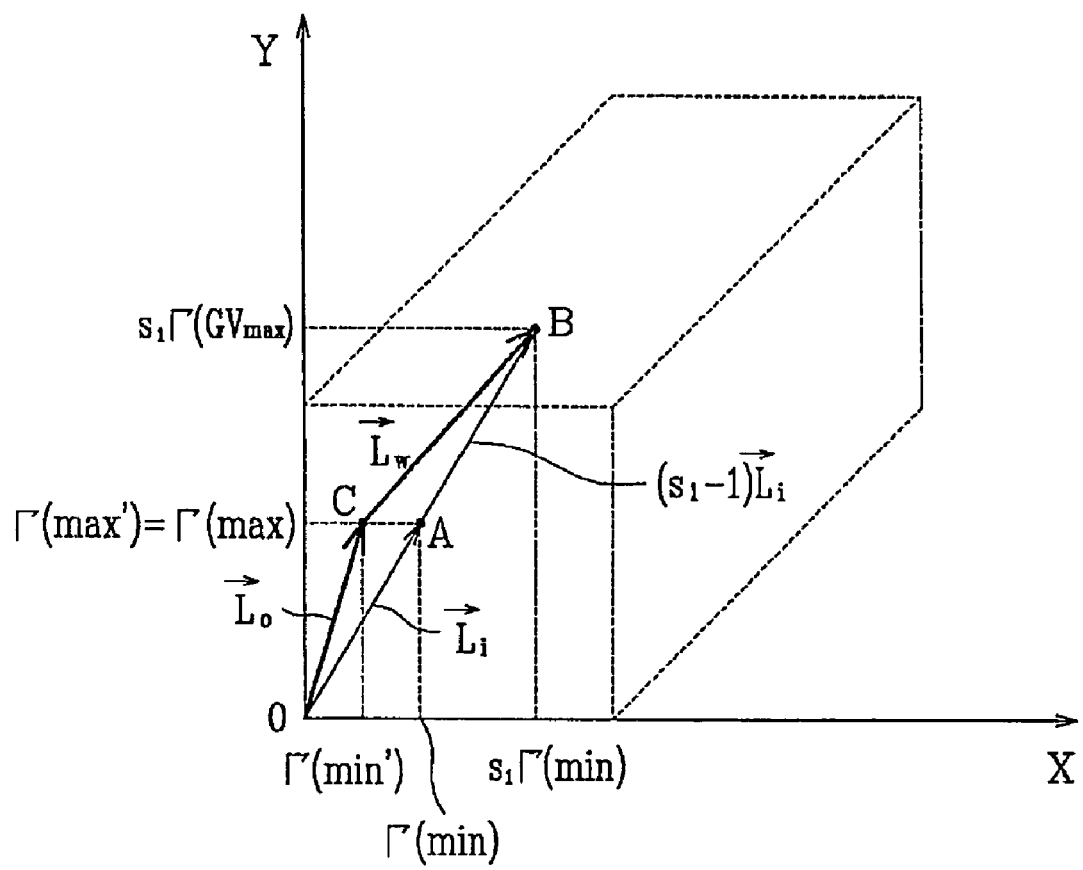
FIG. 15 is a graph illustrating the luminance vector of the white signal and the luminance vector of the output three-color signals according to another embodiment of the present invention.

FIG. 15 is a graph illustrating the luminance vector of the white signal and the luminance vector of the output three-color signals according to another embodiment of the present invention.

Here, it is assumed in FIG. 15 that Y axis represents the image signal having the maximum luminance value and X axis represents another image signal.

This embodiment determines the maximum luminance values Γ(max') of the output three-color signals to be equal to the maximum luminance values Γ(max) of the input three-color signals. That is, $$\Gamma(\text{max}')=\Gamma(\text{max}).\qquad\text{Relation 49}$$

At this time, the luminance vector $\vec{L}_w$ of the white signal and the gray vector $\vec{O}$ of the output three-color image signals can be obtained from Relations 35 and 36.

$$\vec{L} = \begin{pmatrix} (s_1-1)\Gamma(\text{max}) \\ (s_1-1)\Gamma(\text{max}) \\ (s_1-1)\Gamma(\text{max}) \end{pmatrix}; \text{ and} \qquad\text{Relation 50}$$

$$\vec{O} = \begin{pmatrix} \text{max}' \\ \text{mid}' \\ \text{min}' \end{pmatrix} = \begin{pmatrix} \text{max} \\ \Gamma^{-1}(s_1\Gamma(\text{mid})-\Gamma(W)) \\ \Gamma^{-1}(s_1\Gamma(\text{min})-\Gamma(W)) \end{pmatrix} \qquad\text{Relation 51}$$

$$= \begin{pmatrix} \text{max} \\ \Gamma^{-1}(s_1\Gamma(\text{mid})-(s_1-1)\Gamma(\text{max})) \\ \Gamma^{-1}(s_1\Gamma(\text{min})-(s_1-1)\Gamma(\text{max})) \end{pmatrix}$$

$$= \begin{pmatrix} \text{max} \\ \Gamma^{-1}(s_1[\Gamma(\text{mid})-\Gamma(\text{max})]+\Gamma(\text{max})) \\ \Gamma^{-1}(s_1[\Gamma(\text{min})-\Gamma(\text{max})]+\Gamma(\text{max})) \end{pmatrix}.$$

Now, a method of converting the three-color image signals into the four-color image signals based on the rule described with reference to FIG. 15 according to an embodiment of the present invention is described in detail with reference to FIG. 16.

Figure 16:
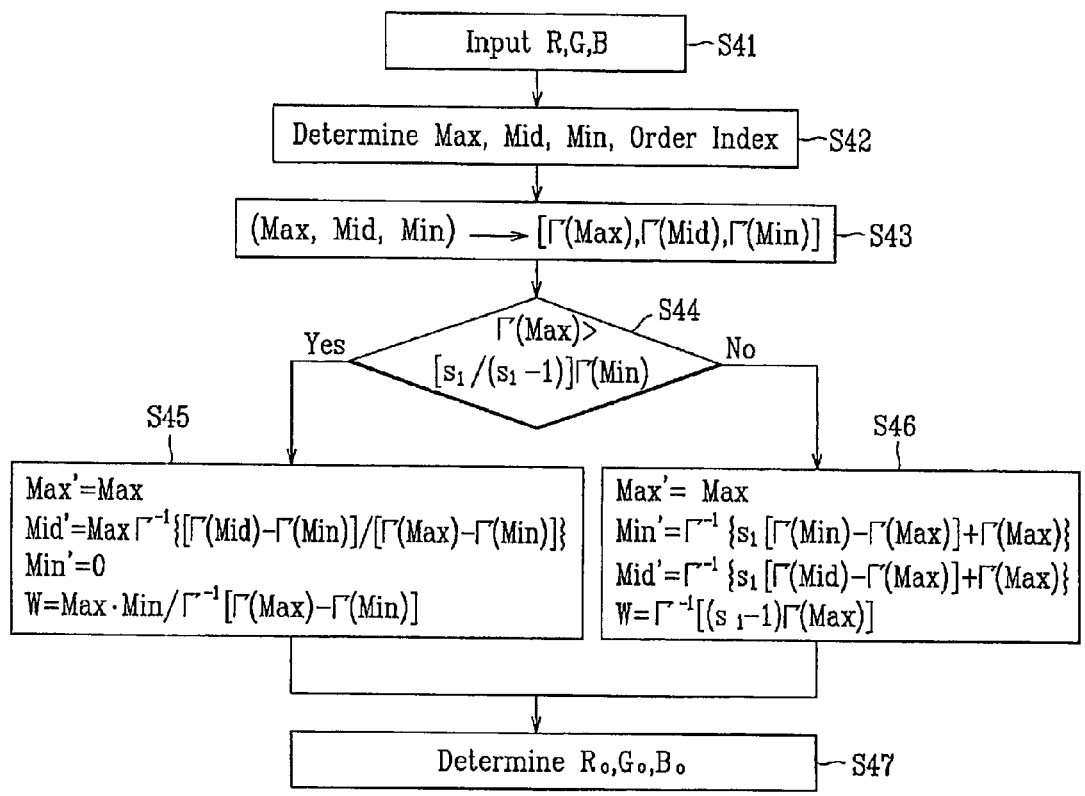

FIG. 16 is a flow chart illustrating a method of converting the three-color image signals into the four-color image signals according to another embodiment of the present invention.

The conversion shown in FIG. 16 is almost the same as that shown in FIG. 14. That is, when a set of red, green, and blue signals having gray values $R_i$, $G_i$, and $B_i$ are received (S41), the gray values $R_i$, $G_i$, and $B_i$ are arranged in order and assigned with order indices (S42). For example, as in FIG. 14, If $R_i \geq G_i \geq B_i$, Max=$R_i$, Mid=$G_i$, Min=$B_i$, and Order Index=1;

If $R_i \geq B_i \geq G_i$, Max=$R_i$, Mid=$B_i$, Min=$G_i$, and Order Index=2;

If $G_i \geq B_i \geq R_i$, Max=$G_i$, Mid=$B_i$, Min=$R_i$, and Order Index=3;

If $G_i \geq R_i \geq B_i$, Max=$G_i$, Mid=$R_i$, Min=$B_i$, and Order Index=4;

If $B_i \geq R_i \geq G_i$, Max=$B_i$, Mid=$R_i$, Min=$G_i$, and Order Index=5; and If $B_i \geq G_i \geq R_i$, Max=$B_i$, Mid=$G_i$, Min=$R_i$, and Order Index=6. Relation 52

Then, the values Max, Mid, and Min are gamma converted (S43).

Next, it is determined, using the values Γ(Max) and Γ(Min) obtained by gamma conversion, which area the three-color image signals belong to among the variable scaling area VS and the fixed scaling area FS (S44). That is, it is determined whether $\Gamma(\text{Max})>[s_1/(s_1-1)]\Gamma(\text{Min})$. When $\Gamma(\text{Max})>[s_1/(s_1-1)]\Gamma(\text{Min})$, the three-color image signals belong to the variable scaling area VS and it goes to the step S45. If the relation $\Gamma(\text{Max})>[s_1/(s_1-1)]\Gamma(\text{Min})$ is not satisfied, it goes to the step S46.

When the input image signals belong to the variable scaling area VS, the gray values Max', Mid', Min', and W of the output four-color image signals are determined using Relations 38 and 39 like the method shown in FIG. 14 (S45).

That is,

Max'=Max;

Mid'=MaxΓ$^{-1}${[Γ(mid)−Γ(min)]/[Γ(max)−Γ(min)]};

Min'=0; and $W$=Max Min/Γ$^{-1}$[Γ(max)−Γ(min)]. Relation 53

When the input image signals belong to the fixed scaling area FS, the gray values Max', Mid', Min', and W are determined by using Relation 51 (S46).

That is,

Max'=Max;

Mid'=Γ$^{-1}$$\{s_1[\Gamma(\text{mid})-\Gamma(\text{max})]+\Gamma(\text{max})\}$;

Min'=Γ$^{-1}$$\{s_1[\Gamma(\text{min})-\Gamma(\text{max})]+\Gamma(\text{max})\}$; and $W$=Γ$^{-1}$[$(s_1-1)\Gamma(\text{max})$]. Relation 54

When the scaling factor $s_1$ is two, for example, Relation 54 is rewritten,

Max'=Max;

Mid'=Γ$^{-1}$[2Γ(mid)+Γ(max)];

Min'=Γ$^{-1}$[2Γ(min)+Γ(max)]; and $W$=Max. Relation 55

The Order Index conserves the order of the gray values of the input signals as follows:

If Order Index=1, $R_o$=Max', $G_o$=Mid', and $B_o$=Min';

If Order Index=2, $R_o$=Max', $G_o$=Min', and $B_o$=Mid';

If Order Index=3, $R_o$=Min', $G_o$=Max', and $B_o$=Mid';

If Order Index=4, $R_o$=Mid', $G_o$=Max', and $B_o$=Min';

If Order Index=5, $R_o$=Mid', $G_o$=Min', and $B_o$=Max'; and

If Order Index=6, $R_o$=Min', $G_o$=Mid', and $B_o$=Max'. Relation 56

Therefore, the gray values $R_o$, $G_o$, and $B_o$ of red, green and blue output signals are determined by Relation 56 (S47).

Figure 17A:
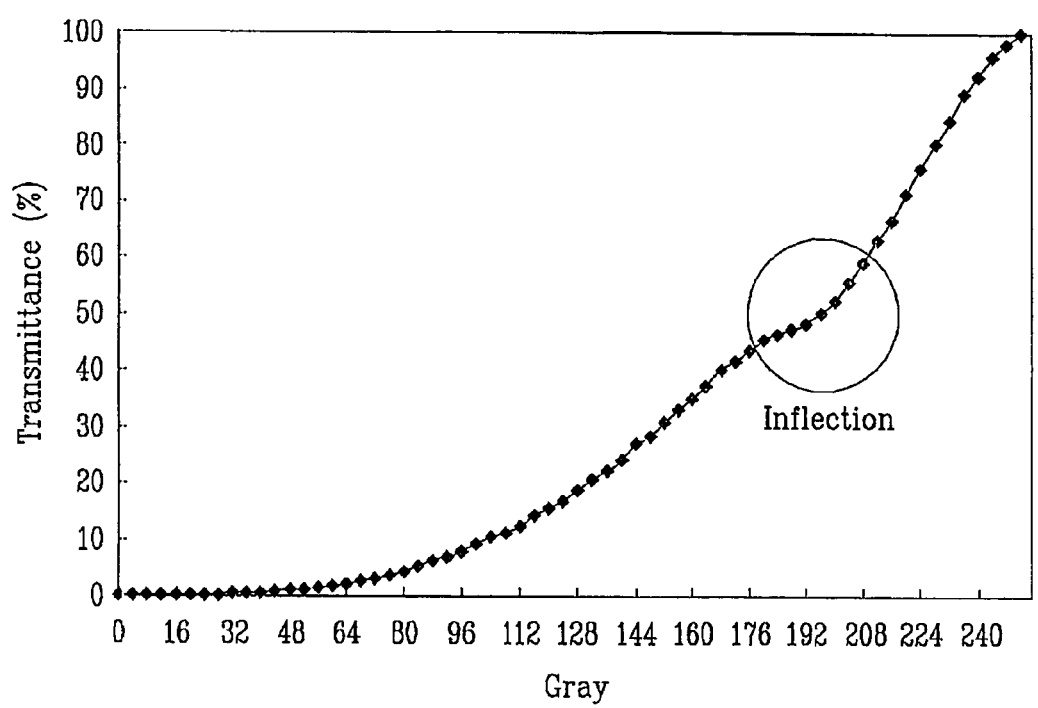
FIGS. 17A and 17B are graphs illustrating gamma curves that are generated by the methods shown in FIGS. 14 and 16.
Figure 17B:
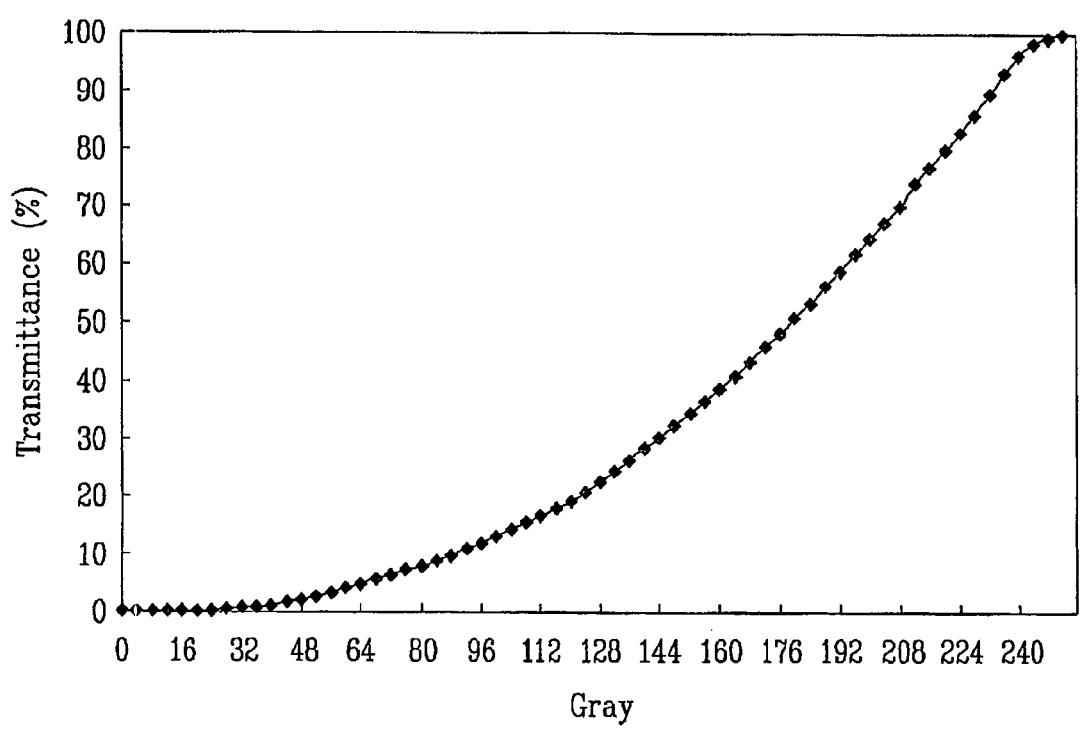
Figure 18A:
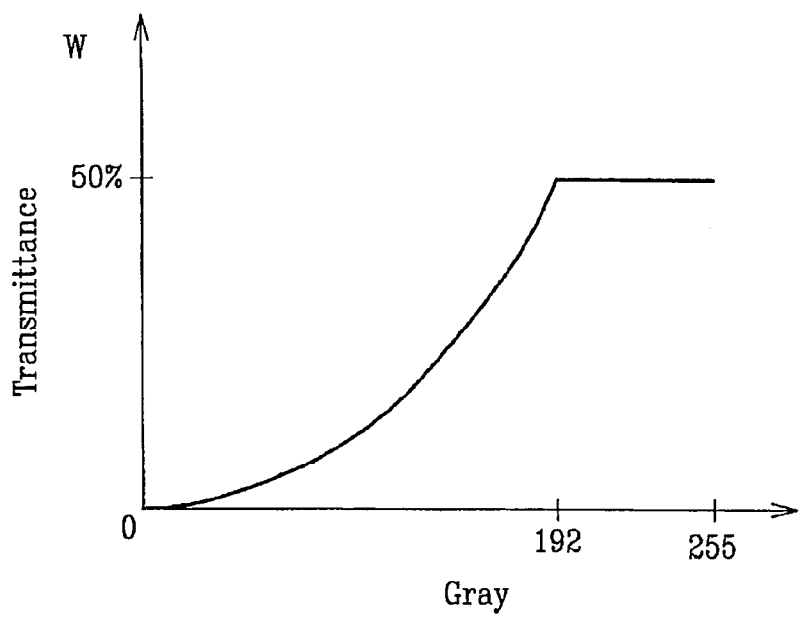
FIGS. 18A and 18B are graphs illustrating a gamma curve of a white signal and a gamma curve of the output three-color signals, which are decomposed from the gamma curve shown in FIG. 17A.
Figure 18B:
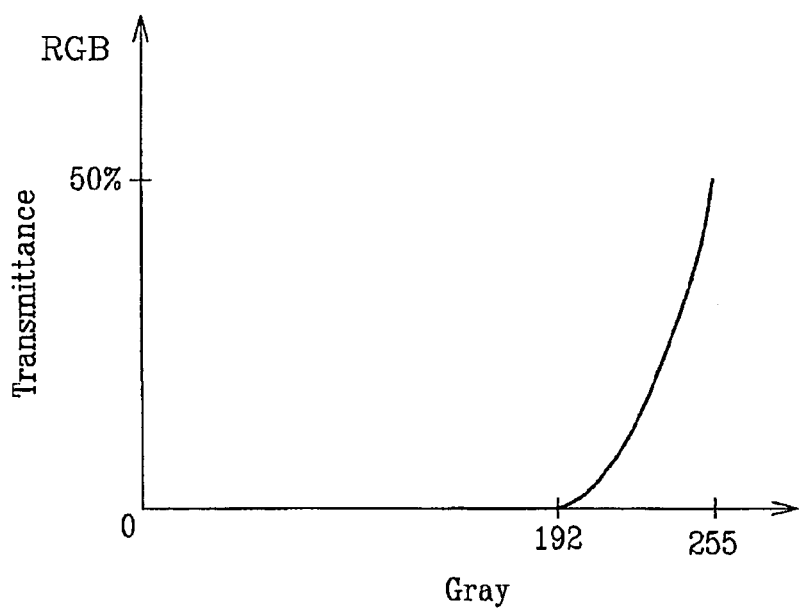
Figure 19A:
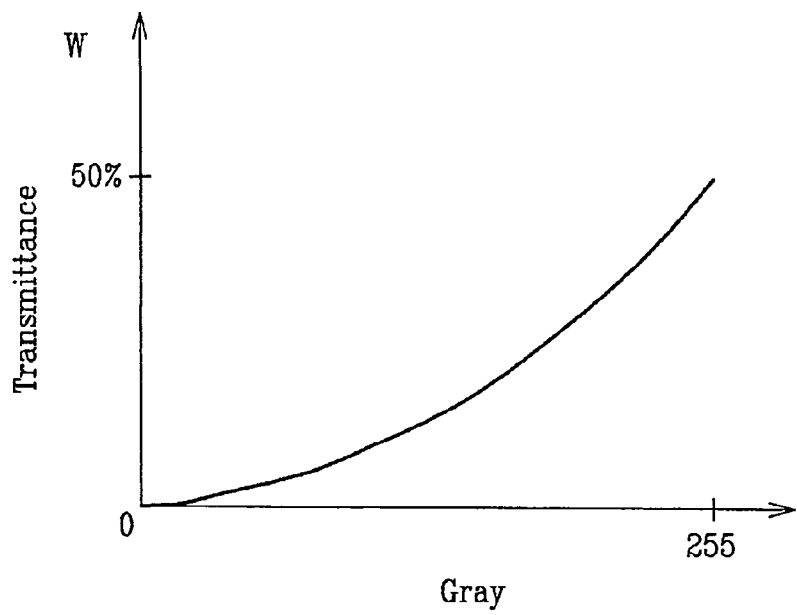
FIGS. 19A and 19B are graphs illustrating a gamma curve of a white signal and a gamma curve of the output three-color signals, which are decomposed from the gamma curve shown in FIG. 17B.
Figure 19B:
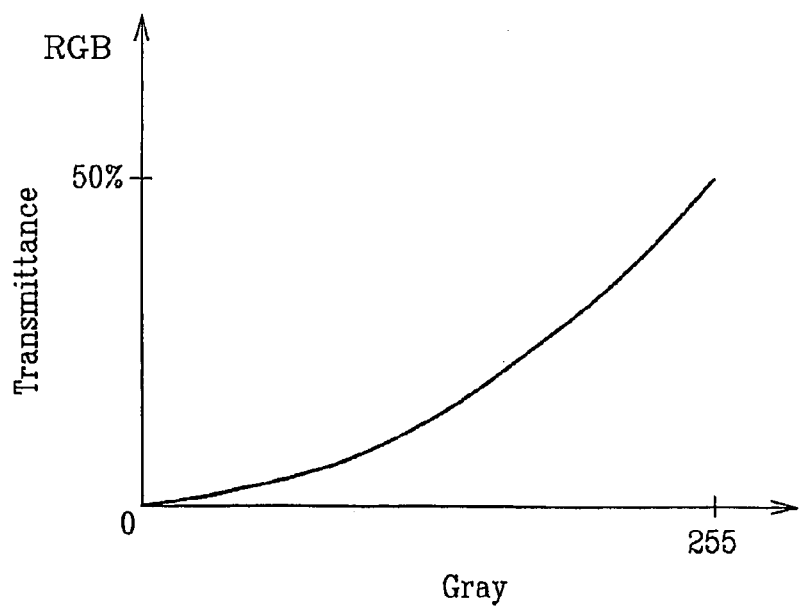

FIGS. 17A and 17B are graphs illustrating gamma curves that are generated by the methods shown in FIGS. 14 and 16. FIGS. 18A and 18B are graphs illustrating a gamma curve of a white signal and a gamma curve of the output three-color signals, which are decomposed from the gamma curve shown in FIG. 17A. FIGS. 19A and 19B are graphs illustrating a gamma curve of a white signal and a gamma curve of the output three-color signals, which are decomposed from the gamma curve shown in FIG. 17B.

FIGS. 17A-19B illustrate graphs showing gamma curves for achromatic color in a four-color LCD where $L=\alpha(GV)^{2.4}$ and the scaling factor $s_1$ is equal to two. The horizontal axis represents the gray of the input three-color image signals and the vertical axis represents the light transmittance, i.e., the luminance. Here, the number of the grays is equal to 256 from zero to 255, which is available for 8-bit input image signals.

Although the gamma curve shown in FIG. 17A has an inflection point near the 192-th gray, the gamma curve shown in FIG. 17B has no inflection point.

The difference is caused by the difference in the addition of the gamma curve of the white signal and the gamma curve of the output three-color image signals, i.e., the assignment of the luminance to the white signal and the output three-color signals.

In the method illustrated in FIG. 14, the white signal is assigned with the maximum luminance by making the luminance vector $\vec{L}_w$ of the white signal be determined by drawing a line until the line meets Y axis unless the gray is higher than the highest gray $W_{max}$ as shown in FIGS. 12A and 12B.

Referring to FIGS. 17A and 17B, when the gray of the three-color input image signals is equal to the 192-th gray, for example, the transmittance is equal to about 50%. The multiplication of the scaling factor $s_1$ equal to two yields 100% transmittance, which corresponds to the highest, 255-th gray of the white signal and to the zero-th gray of the output three-color image signals. When the gray of the input three-color signals is equal to 208 corresponding to the transmittance of about 60%, the multiplication of the scaling factor $s_1$ yields the transmittance of 120%. Then, the white signal is in charge of 100% and the three-color image signals are in charge of remaining 20%. Then, the gray value of the white signal is equal to 255 as described above, and the gray value of the output three-color image signals is equal to about 128 corresponding to the transmittance of 20%.

To summarize, when the three-color input image signals are lower than 192, only the gray of the white signal ranges from zero to 255. When the three-color input image signals are in a range from 193 to 255, the white signal maintains its highest, 255 gray, while the output three-color image signals ranges from zero to 255.

In view of gamma curves shown in FIGS. 18A and 18B, the gamma curve W of the white signal has an exponential form from the zero-th gray to the 192-th gray of the three-color input image signals and is saturated in 50% transmittance from the 193-th gray to the 255-th gray. The gamma curve RGB of the output three-color signals exhibits an exponential form varying as the input three-color input signal varies from the 193-th gray to the 255-th gray.

In the meantime, the gamma curve is an exponential function that has a gradient increasing as the gray increases. Accordingly, the addition of the two exponential functions may yield an inflection point near the 192-th gray and the 293-th gray, which correspond to the end point and the start point of the two gamma curves, due to the difference in the gradient. The luminance difference near the inflection point is very small such that it is hard to distinguish the luminance difference between grays.

On the contrary, in the method shown in FIG. 16, a line segment representing the luminance vector $\vec{L}_w$ of the white signal extends only to a point where it meets a rectangle having a diagonal OA as shown in FIG. 15. This means that both the two gamma curves operate in all the gray ranges.

When the scaling factor $s_1$ is equal to two, the white signal and the three-color image signals are in charge of the luminance by a ratio of 1:1 over all the grays as. For example, when the gray of the input three-color signals is equal to 192, the transmittance is equal to about 50%, the multiplication of the scaling factor s1 yields 100% transmittance. Accordingly, the white signal is in charge of 50% transmittance, and the output three-color signals are also in charge of 50% transmittance such that both the white signal and the output three-color signals have the 192-th gray. As a result, the gamma curve W of the white signal is substantially equivalent to the gamma curve RGB of the output three-color signals as shown in FIGS. 19A and 19B, which are added to each other to generate the gamma curve without an inflection point as shown in FIG. 17B. Although the gradient of the gamma curve may be varied depending on the scaling factor $s_1$, there may be still no inflection point.

Accordingly, a gamma curve having no inflection point is generated, thereby obtaining distinct image quality.

According to the present invention, the removal of the discontinuity in the gamma curve makes distinct images and the simplification of the conversion of the three-color image signals into the four-color image signals reduce the cost of the calculation chip and the calculation errors such as quantization error.

In one embodiment, the gamma conversion and the reverse gamma conversion are performed by using a look-up table.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An apparatus for driving a display device including a plurality of four color pixels, the apparatus comprising:
   an input unit receiving input three-color image signals;
   an image signal modifier converting the three-color image signals into output four-color image signals such that a maximum gray among an input R signal, an input G signal, and an input B signal of the input three-color image signals is equal to a maximum gray among an output R signal, an output G signal, and an output B signal of the output four-color image signals, and another gray of the output R signal, G signal, and B signal is derived from the maximum gray and at least one other gray of the input R signal, G signal, and B signal; and
   an output unit outputting the output four-color image signals,
   wherein the image signal modifier compares grays of the input three-color image signals, determines a maximum input gray, a middle input gray, and a minimum input gray, and assigns order indices based thereon,
   gamma and reverse gamma converts the maximum input gray, the middle input gray, and the minimum input gray to obtain a maximum output gray (Max'), a middle output gray (Mid'), a minimum output gray (Min'), and an output white gray (W) of the output four-color image signals, and
   generates the output four-color image signals based on the order indices, wherein the maximum input gray (Max), the middle input gray (Mid), and the minimum input gray (Min) have relations with the maximum output gray (Max'), the middle output gray (Mid'), the minimum output gray (Min'), and the output white gray (W) as follows:

when $\Gamma(Max) > [s_1/s_1-1]\Gamma(Min)$,

Max'=Max;

Mid'=Max $\Gamma^{-1}[\Gamma(Mid)-\Gamma(Min)]/[\Gamma(Max)-\Gamma(Min)]$;

Min'=0; and $W$=Max Min/$\Gamma^{-1}[\Gamma(Max)-\Gamma(Min)]$, where $\Gamma$ is a gamma conversion function, $\Gamma^{-1}$ is a reverse gamma conversion function, and $s_1$ is a scaling factor, and wherein the maximum input gray (Max), the middle input gray (Mid), and the minimum input gray (Min) have relations with the maximum output gray (Max'), the middle output gray (Mid'), the minimum output gray (Min'), and the output white gray (W) as follows:

when $\Gamma(Max) \leq [s_1/s_1-1]\Gamma(Min)$,

Max'=Max;

Mid'=$\Gamma^{-1}\{s_1[\Gamma(Mid)-\Gamma(Max)]+\Gamma(Max)\}$; and $W$=$\Gamma^{-1}[(s_1-1)\Gamma(Max)]$, where $\Gamma$ is a gamma conversion function, $\Gamma^{-1}$ is a reverse gamma conversion function, and $s_1$ is a scaling factor.

2. The apparatus of claim 1, wherein the gamma function satisfies:

$\Gamma(xy) = \Gamma(x)\Gamma(y)$; and $\Gamma^{-1}(pq) = \Gamma^{-1}(p)\Gamma^{-1}(q)$.

3. The apparatus of claim 2, wherein the gamma function is an exponential function.

4. The apparatus of claim 3, wherein the power of the gamma function is equal to 2.4.

5. The apparatus of claim 1, wherein the scaling factor is equal to two.

6. The apparatus of claim 1, further comprising:
a gray voltage generator generating a plurality of gray voltages; and
a data driver that selects gray voltages among the plurality of gray voltages corresponding to the output four-color image signals and outputs the selected gray voltages to the pixels as data voltages.

7. The apparatus of claim 1, wherein an output white signal and output three-color image signals of the output four-color image signals are used together for substantially all grays of achromatic color.

8. An apparatus for driving a display device including a plurality of four color pixels, the apparatus comprising:
an input unit receiving input three-color image signals;
an image signal modifier converting the three-color image signals into output four-color image signals such that a gamma curve for achromatic color of the display device has no inflection point below about a 94 percent transmittance of the gamma curve, wherein the gamma curve is a relationship between a gray of one of the input three-color image signals and the transmittance of a-corresponding one of the four-color image signals; and
an output unit outputting the output four-color image signals,
wherein the image signal modifier
compares grays of the input three-color image signals, determines a maximum input gray (Max), a middle input gray (Mid), and a minimum input gray (Min), and assigns order indices based thereon,
gamma and reverse gamma converts the maximum input gray, the middle input gray, and the minimum input gray to obtain a maximum output gray (Max'), a middle output gray (Mid'), a minimum output gray (Min'), and an output white gray (W) of the output four-color image signals, and
generates the output four-color image signals based on the order indices, wherein the maximum input gray (Max), the middle input gray (Mid), and the minimum input gray (Min) have relations with the maximum output gray (Max'), the middle output gray (Mid'), the minimum output gray (Min'), and the output white gray (W) as follows:

when $\Gamma(Max) > [s_1/(s_1-1)]\Gamma(Min)$,

Max'=Max;

Mid'=Max $\Gamma^{-1}[\Gamma(Mid)-\Gamma(Min)]/[\Gamma(Max)-\Gamma(Min)]$;

Min'=0; and $W$=Max Min/$\Gamma^{-1}[\Gamma(Max)-\Gamma(Min)]$, where $\Gamma$ is a gamma conversion function, $\Gamma^{-1}$ is a reverse gamma conversion function, and $s_1$ is a scaling factor, and wherein the maximum input gray (Max), the middle input gray (Mid), and the minimum input gray (Min) have relations with the maximum output gray (Max'), the middle output gray (Mid'), the minimum output gray (Min'), and the output white gray (W) as follows:

when $\Gamma(Max) \leq [s_1/s_1-1]\Gamma(Min)$,

Max'=Max;

Mid'=$\Gamma^{-1}\{s_1[\Gamma(Mid)-\Gamma(Max)]+\Gamma(Max)\}$;

Min'=$\Gamma^{-1}\{s_1[\Gamma(Min)-\Gamma(Max)]+\Gamma(Max)\}$; and $W$=$\Gamma^{-1}[(s_1-1)\Gamma(Max)]$, where $\Gamma$ is a gamma conversion function, $\Gamma^{-1}$ is a reverse gamma conversion function and $s_1$ is a scaling factor.

9. The apparatus of claim 8, wherein the gamma function is an exponential function.

10. The apparatus of claim 9, wherein the scaling factor is equal to two.

11. The apparatus of claim 8, wherein a gray among an input R signal, an input G signal, and an input B signal of the input three-color image signals is equal to a maximum gray among an output R signal, an output G signal, and an output B signal of the output four-color image signals.

12. The apparatus of claim 8, wherein an output white signal and output three-color image signals of the output four-color image signals are used together for substantially all grays of achromatic color.

13. A method for driving a display device including a plurality of four color pixels, the method comprising:
assigning order indices after comparing grays of the input three-color image signals and determining a maximum input gray (Max), a middle input gray (Mid), and a minimum input gray (Min);
gamma converting ($\Gamma$) and reverse gamma converting ($\Gamma^{-1}$) the maximum input gray, the middle input gray, and the minimum input gray;

obtaining a maximum output gray (Max'), a middle output gray (Mid'), a minimum output gray (Mid'), and an output white gray (W), from relations Max'=Max;

Mid'=Max $\Gamma^{-1}[\Gamma(\text{Mid})-\Gamma(\text{Min})]/\Gamma(\text{Max})-\Gamma(\text{Min})]$, Min'=0, and W=Max Min$\Gamma^{-1}[\Gamma(\text{Max})-\Gamma(\text{Min})]$, when $\Gamma$ (Max)>$[s_1/s_1-1]\Gamma$ (Min) (where $s_1$ is a scaling factor); and from relations Max'=Max;

Mid'=$\Gamma^{-1}\{s_1[\Gamma(\text{Mid})-\Gamma(\text{Max})]+\Gamma(\text{Max})]$, Min'=$\Gamma^{-1}\{s_1[\Gamma(\text{Min})-\Gamma(\text{Max})]+\Gamma(\text{Max})]$, and W=$\Gamma^{-1}[(s_1-1)\Gamma(\text{Max})]$, when $\Gamma$ (Max)$\leq$$[s_1/s_1-1]\Gamma$ (Min); and generating four-color image signals having the maximum output gray, the middle output gray, the minimum output gray, and the output white gray according to the order given by the order indices.

14. The method of claim 13, wherein the gamma conversion and the reverse gamma conversion are performed by using a look-up table.

15. The method of claim 13, further comprising:

generating a plurality of gray voltages;

selecting data voltages among the plurality of gray voltages corresponding to the four-color image signals; and applying the data voltages to the pixels.

\* \* \* \* \*